(12) United States Patent
Taylor

(10) Patent No.: US 7,642,550 B2
(45) Date of Patent: Jan. 5, 2010

(54) MULTI-LAYER STRUCTURES FOR PARAMETER MEASUREMENT

(75) Inventor: Ted L. Taylor, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 251 days.

(21) Appl. No.: 11/492,342

(22) Filed: Jul. 25, 2006

(65) Prior Publication Data

US 2008/0029913 A1    Feb. 7, 2008

(51) Int. Cl.
*H01L 23/58* (2006.01)
*H01L 23/48* (2006.01)
*H01L 23/52* (2006.01)
*H01L 29/40* (2006.01)

(52) U.S. Cl. .......................... 257/48; 257/750; 257/758
(58) Field of Classification Search ................... 257/48, 257/E23.179, E21.529, 751–758
See application file for complete search history.

(56) References Cited

U.S. PATENT DOCUMENTS 6,819,426 B2 * 11/2004 Sezginer et al. ............. 356/401
6,822,260 B1   11/2004 Nariman et al.
6,972,853 B1   12/2005 Stirton et al.

OTHER PUBLICATIONS

Ku et al., "Performance study of CD mark size for angular scatterometry," *SPIE Microlithography World* (2005).
Jekauc et al., "Metal etcher qualification using angular scatterometry," *SPIE Microlithography World* (2005).
Niu et al., "Specular spectroscopic scatterometry," *IEEE Transactions on Semiconductor Manufacturing* 14(2): 97-111 (2001).
Thony et al., "Review of CD measurement and scatterometry," Presented at International Conference on Characterization and Metrology for ULSI Technology (2003).

* cited by examiner

*Primary Examiner*—Cuong Q Nguyen
(74) *Attorney, Agent, or Firm*—Knobbe Martens Olson & Bear, LLP

(57) ABSTRACT

Various embodiments disclosed herein include methods for measuring a parameter associated with a workpiece. Such a method may include providing a first overlay pattern on the workpiece and a second overlay pattern over the first overlay pattern. The first overlay pattern may comprise a first plurality of features spaced apart from each other, and the second overlay pattern may comprise a second plurality of substantially optically transmissive features spaced apart from each other. The second plurality of features may be offset with respect to and partially overlapping the first plurality of features. The method may further comprise directing light onto the first and second overlay pattern such that the light is reflected from both the first and second overlay patterns and using reflectometry to obtain a measure of the parameter from the reflected light.

31 Claims, 17 Drawing Sheets

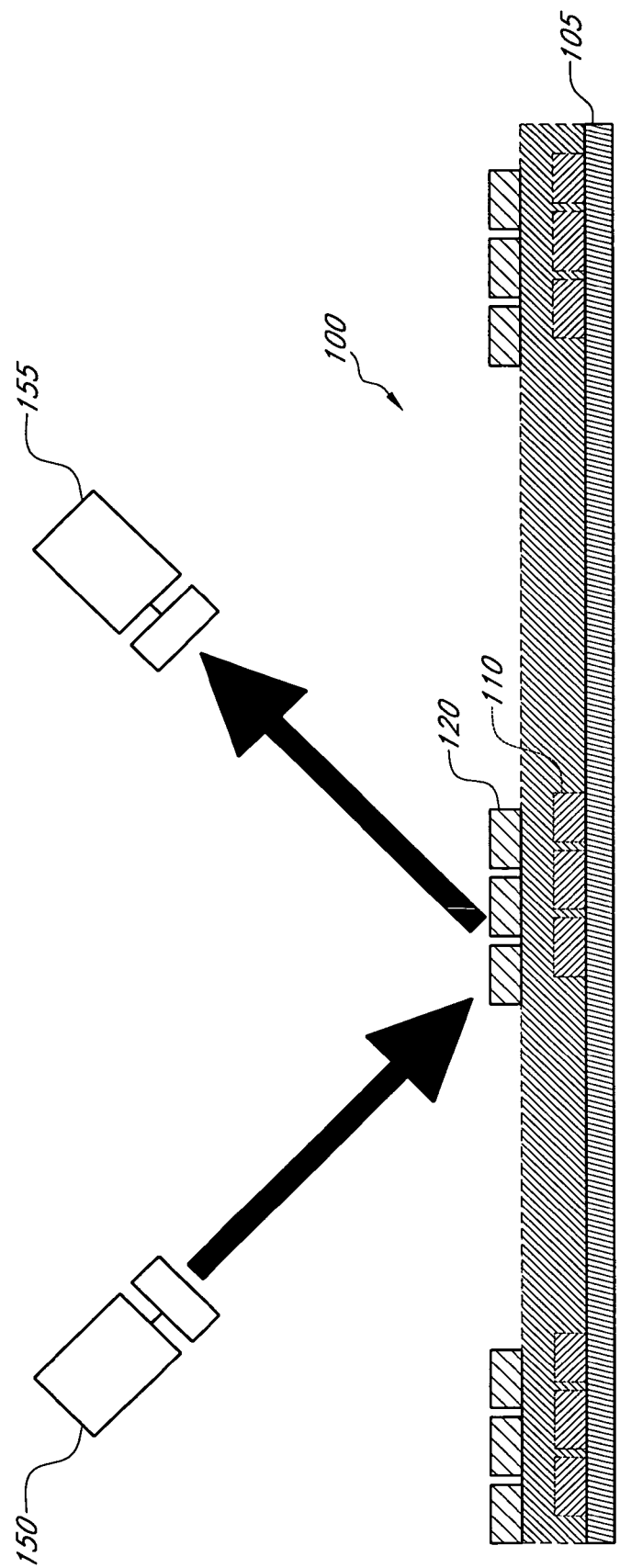

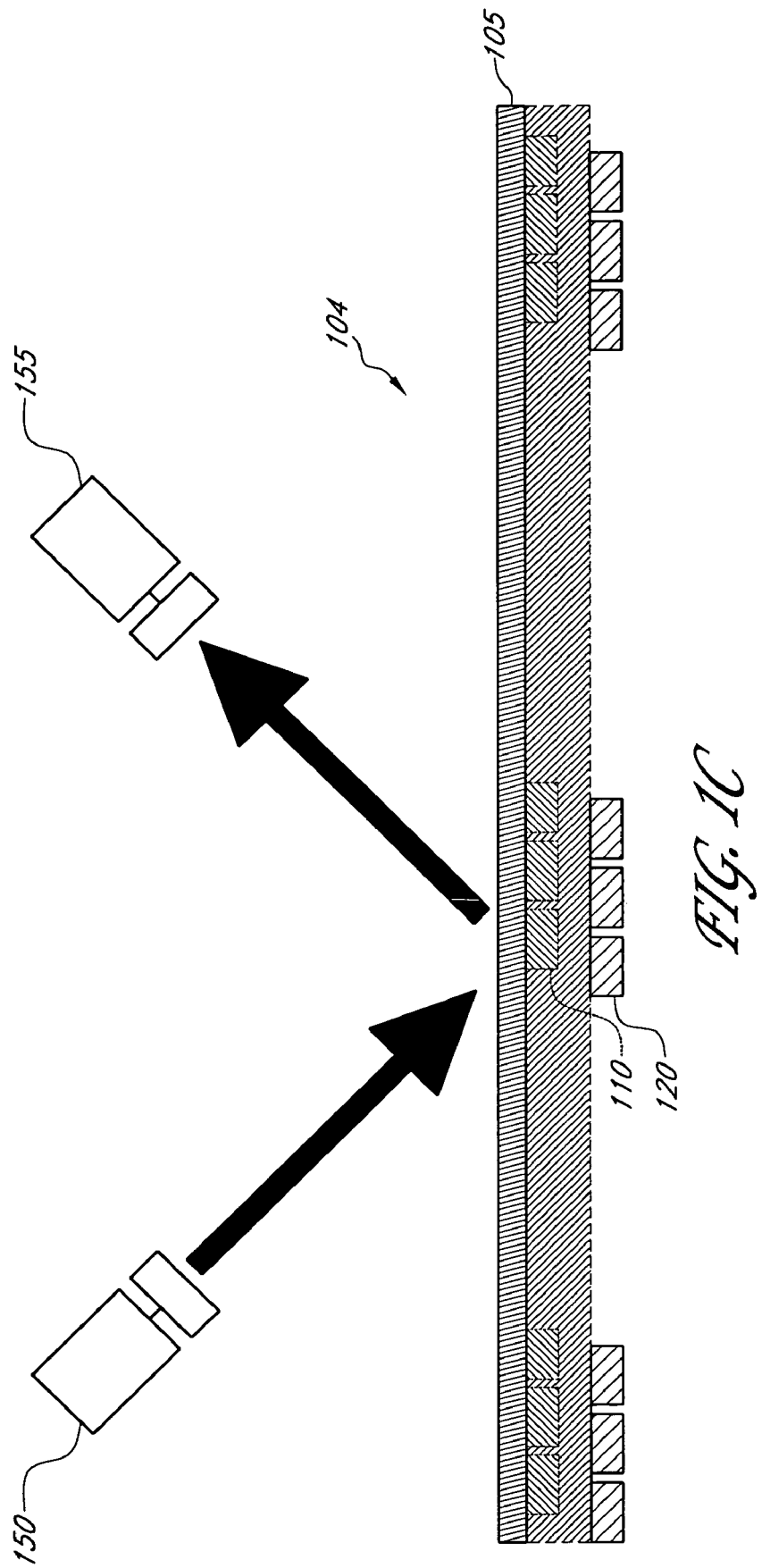

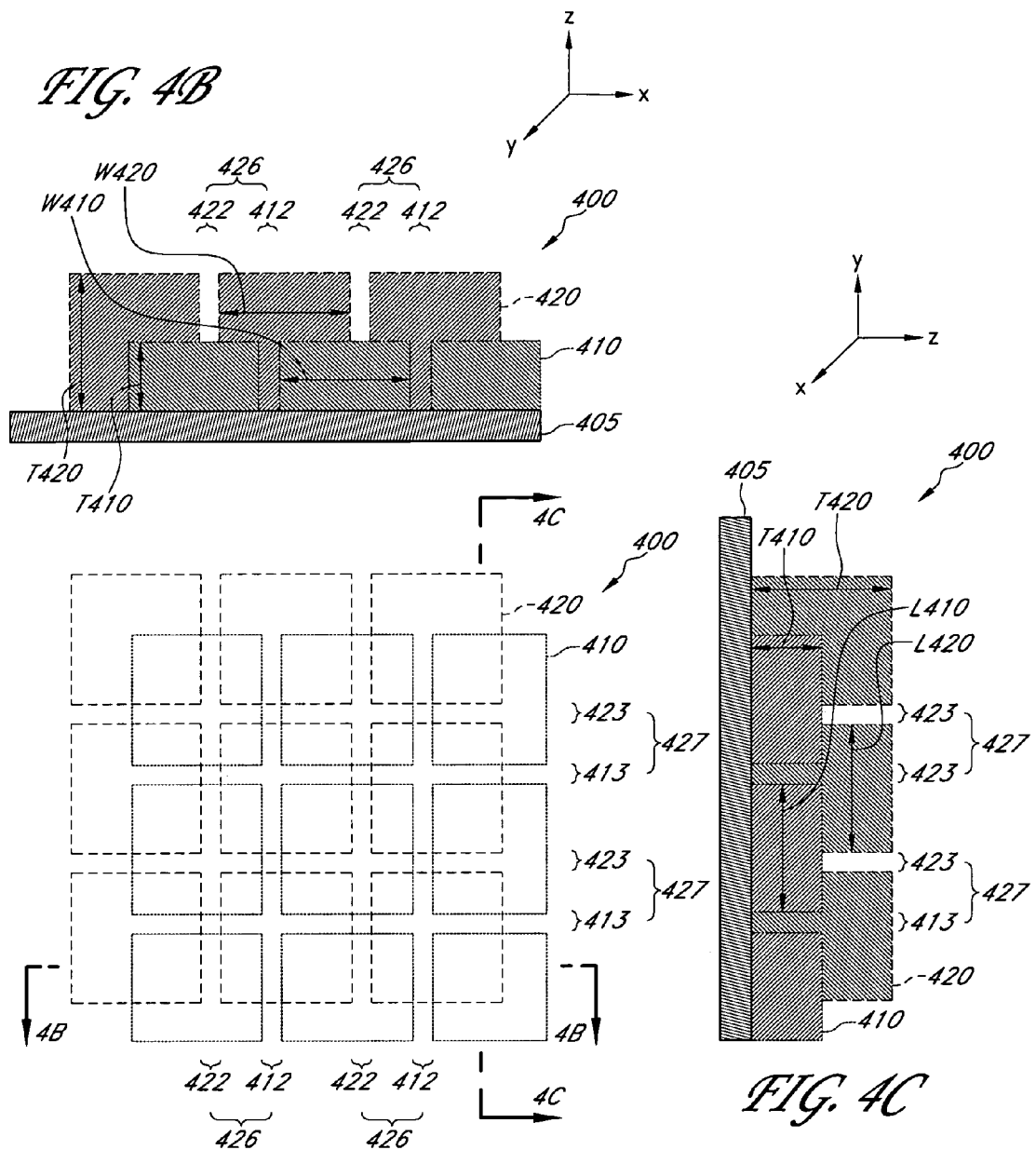

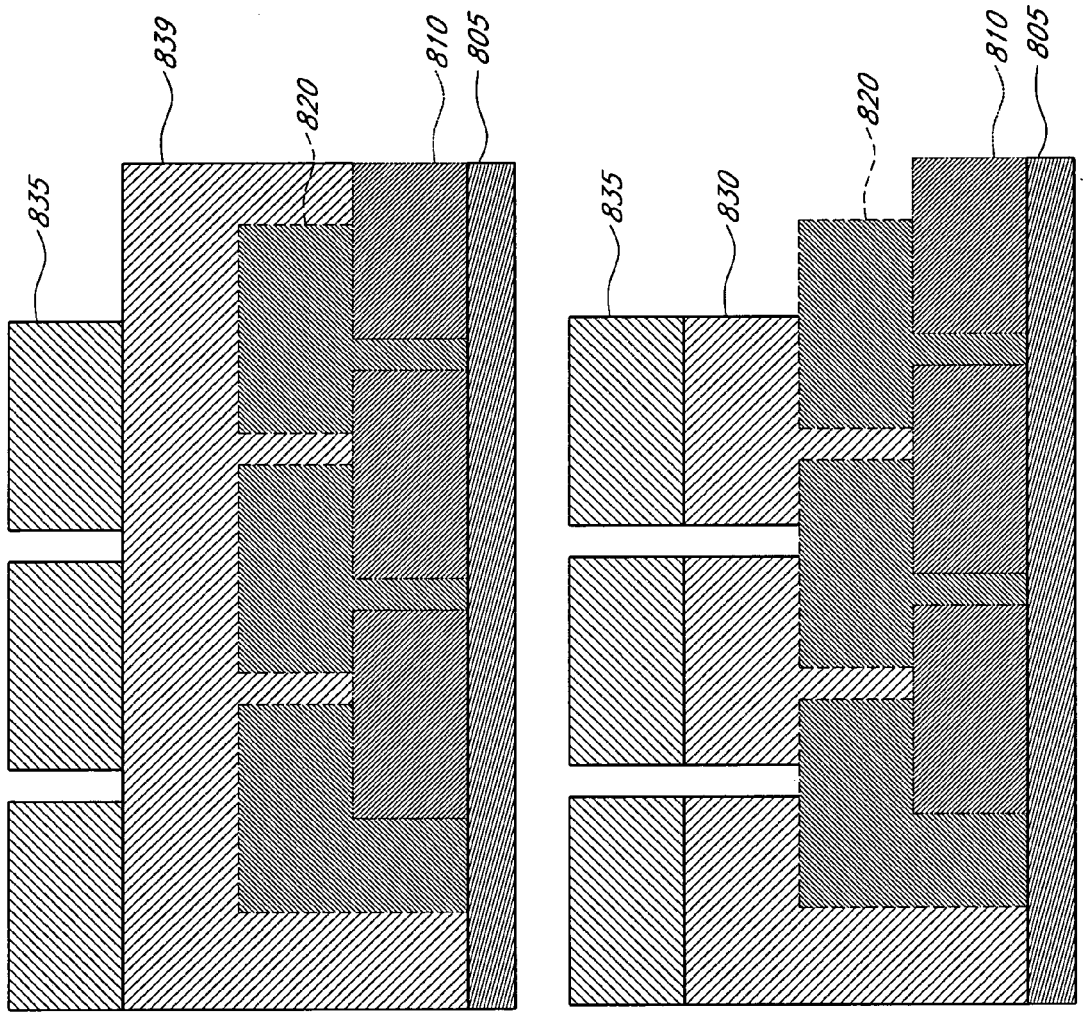

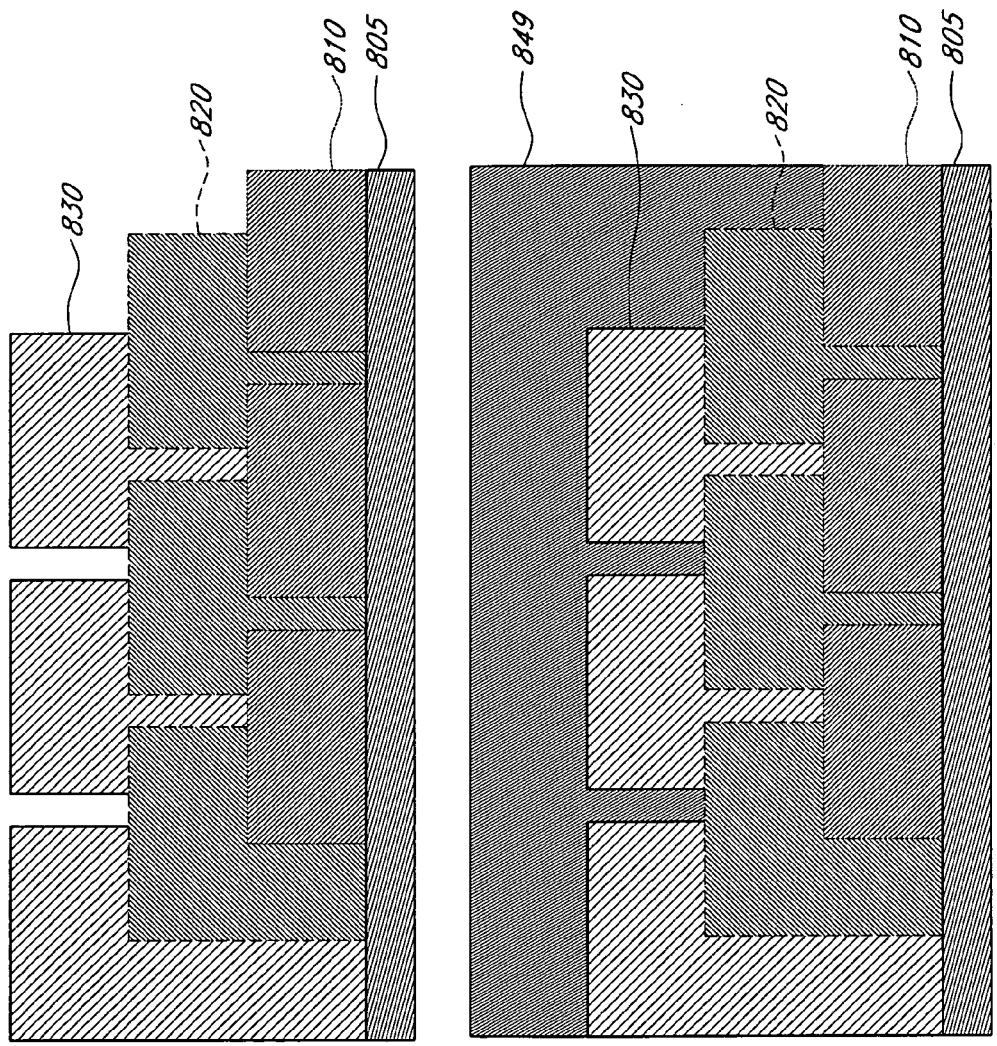

MULTI-LAYER STRUCTURES FOR PARAMETER MEASUREMENT

BACKGROUND

1. Field

Various embodiments of the present invention relate to the manufacturing of semiconductors and multi-layer reticles, and, more particularly, to structures that can indicate parameters of the semiconductor or reticle workpieces.

2. Description of the Related Art

Semiconductor devices and reticles are generally formed by repeating the steps of providing a layer, forming a pattern over the layer, removing the material not covered by the pattern, and removing the pattern. Multiple patterned layers can thereby be formed. For example, as semiconductor device dimensions are reduced, for example to increase device density or to increase device speed, accurate pattern formation becomes increasingly important. Patterned layers that are misaligned with respect to other patterned layers or that are incorrectly sized can lead to devices that do not function properly or fail. Measurement of certain parameters of a patterned layer and adjustment of the patterning process based on such measurements can aid in the formation of patterns that are properly aligned and sized. In particular, measurement of the "overlay" (e.g., how well one pattern is aligned with an underlying pattern or patterns) and the "critical dimensions" (e.g., the sizes of particular features) can verify the accurate formation of patterns.

As the dimensions of devices on workpiece shrink, accurate measurement of overlay and critical dimensions becomes increasingly difficult and necessitates the development of new techniques. For example, some critical dimensions may be on the order of tens of nanometers, thereby requiring non-optical tools such as a scanning electron microscope for measurement.

BRIEF DESCRIPTION OF THE DRAWINGS

Various features, aspects, and advantages of the invention disclosed herein are described below with reference to the drawings of preferred embodiments, which are intended to illustrate and not to limit the invention.

FIGS. 1A-1D illustrate example measurements of a multi-layer structures for parameter measurement.

FIG. 4A illustrates a schematic plan view of yet another embodiment of a multi-layer structure for parameter measurement.

FIG. 4B illustrates a cross-sectional view of the structure of FIG. 4A taken along the line 4B-4B.

FIG. 4C illustrates a cross-sectional view of the structure of FIG. 4A taken along the line 4C-4C.

FIGS. 8A-8J illustrate schematic cross-sectional views of an embodiment of multi-layer structures for parameter measurement at various stages of processing.

DETAILED DESCRIPTION OF CERTAIN PREFERRED EMBODIMENTS

Figure 1B:
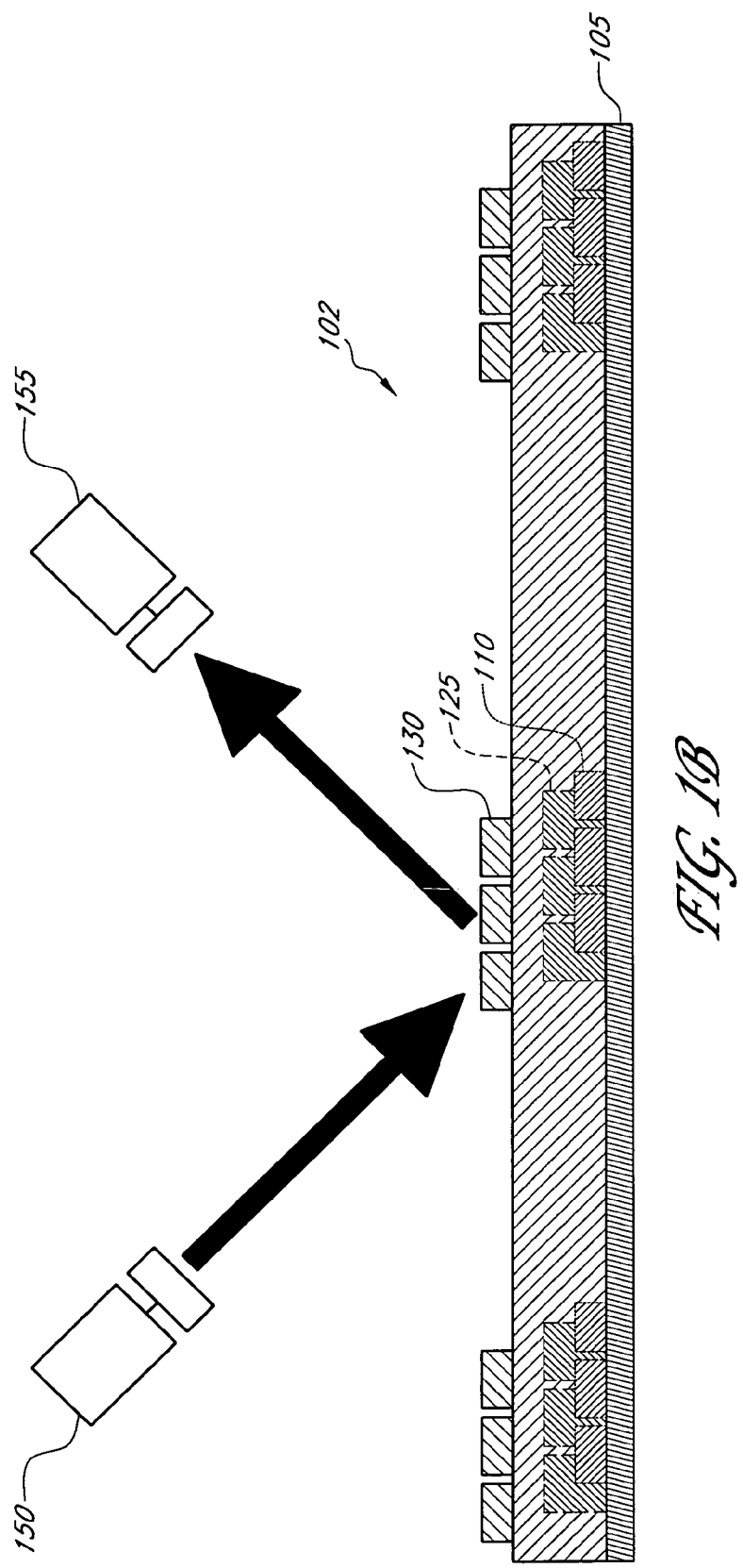

Although certain preferred embodiments and examples are disclosed below, the invention extends beyond the specifically disclosed embodiments and/or uses of the invention and obvious modifications and equivalents thereof. Thus, it is intended that the scope of the invention herein disclosed should not be limited by the particular disclosed embodiments described below.

Reflectometry operates by directing light onto a structure and measuring the light reflected from the structure. Reflectometry can include ellipsometry including spectroscopic ellipsometry and extended ellipsometry, scatterometry including spectroscopic polarization, wavelength-varying scatterometry, and angle-varying scatterometry (or "dome" scatterometry), goniometry, and other methods. Data may be obtained by measuring reflected light. The data may comprise, for example, wavelength or angular distributions in some cases. The measured light in the form of a spectrum or spectra or other data is transformed (e.g., by a computer) depending on the reflectometry method in order to determine a parameter value for the structure. Such calculation may be performed using direct regression and/or libraries. A program that employs rigorous coupled wave theory (RCWT), such as those available from Nanometrics, Inc. of Milpitas, Calif. and from Nova Measuring Instruments, Ltd. of Rehovoth, Israel (or Sunnyvale, Calif. or Phoenix, Ariz.), may be used in some embodiments. Other methods of determining the parameter value based on the measured data may also be employed. Reflectometry can be used, for example, to determine feature widths using the measured light spectra, angular distributions, or other optical data. Comparing the locations and widths of features of different layers can provide the relative overlay of the features. In certain embodiments, reflectometry can be enhanced by forming specific structures on the workpiece. Because reflectometry can measure the widths of features beneath layers that are substantially optically transmissive, optical data representing the reflection of the light from the features on underlying layers can advantageously be used to measure the overlay of more than two layers.

Overlay measurements on more than two layers advantageously allow further verification of the overlay patterns and provides the ability to check the alignment with respect to multiple underlying layers. For example, in a structure comprising first, second, and third layers, reflectometry measurements may be obtained that indicate offset of the third layer with respect to the second layer, the third layer with respect to the first layer, and the second layer with respect to the first layer. Verifying the overlay of the second layer with respect to the first layer may also help to determine the accuracy of a previous measurement of overlay of the second layer with respect to the first layer, or may help to explain misalignment of the third layer with respect to either the first layer or the second layer. Checking the alignment with respect to multiple underlying layers, for example, may help to ensure that certain features in the third layer are properly aligned to both features in the first layer and features in the second layer.

Scatterometry, a type of reflectometry, is a non-destructive optical technique that records and analyzes changes in intensity of light reflected from a periodic scattering surface. By measuring and analyzing the light diffracted from a patterned periodic sample, the dimensions of the periodic structure can be measured. In certain types of scatterometry, light with a wide spectral composition can be directed onto a workpiece at a fixed angle, and the intensity of the light changes relative to changes in wavelength. In "dome" scatterometry, light with a narrow spectral composition is typically directed onto a workpiece at multiple angles, and the intensity of the light changes relative to changes in angle. In some types of scatterometry, a light detector is configured to detect light reflected from multiple directions (e.g., from two directions substantially perpendicular to each other). Other types of scatterometry may also be used.

FIG. 1A schematically illustrates the measurement of a parameter of a workpiece 100 associated with example overlay patterns 110, 120 on a substrate 105. As used herein, the term "workpiece" is to be given its broadest ordinary meaning including, but not limited to, a semiconductor workpiece or a reticle workpiece. Light is directed, for example from an emitter 150, onto the substrate 105 and onto the overlay patterns 110, 120. The light is reflected from the overlay patterns 110, 120. The reflected light is detected, for example by a detector 155. In certain embodiments, reflectometry is used to obtain a measure of the parameter of the workpiece 100 from the reflected light.

FIG. 1B schematically illustrates the measurement of a parameter of a workpiece 102 associated with example overlay patterns 110, 125, 130 on a substrate 105. Light is directed, for example from an emitter 150, onto the substrate 105 and onto the overlay patterns 110, 125, 130. The light is reflected from the overlay patterns 110, 125, 130. The reflected light is detected, for example by a detector 155. In certain embodiments, reflectometry is used to obtain a measure of the parameter of the workpiece 102 from the reflected light.

FIG. 1C schematically illustrates the measurement of a parameter of a workpiece 104 associated with example overlay patterns 110, 120 on a substrate 105. Light is directed, for example from an emitter 150, onto the substrate 105 and onto the overlay patterns 110, 120. The light passes through the substrate 105 and is reflected from the overlay patterns 110, 120. The reflected light is detected, for example by a detector 155. In certain embodiments, reflectometry is used to obtain a measure of the parameter of the workpiece 104 from the reflected light. Skilled artisans will recognize that light reflectors on the side of the workpiece 104 facing away from the emitter 150 and detector 155 can be used in the orientation of the workpiece 100 of FIG. 1A to achieve similar results.

Figure 1D:
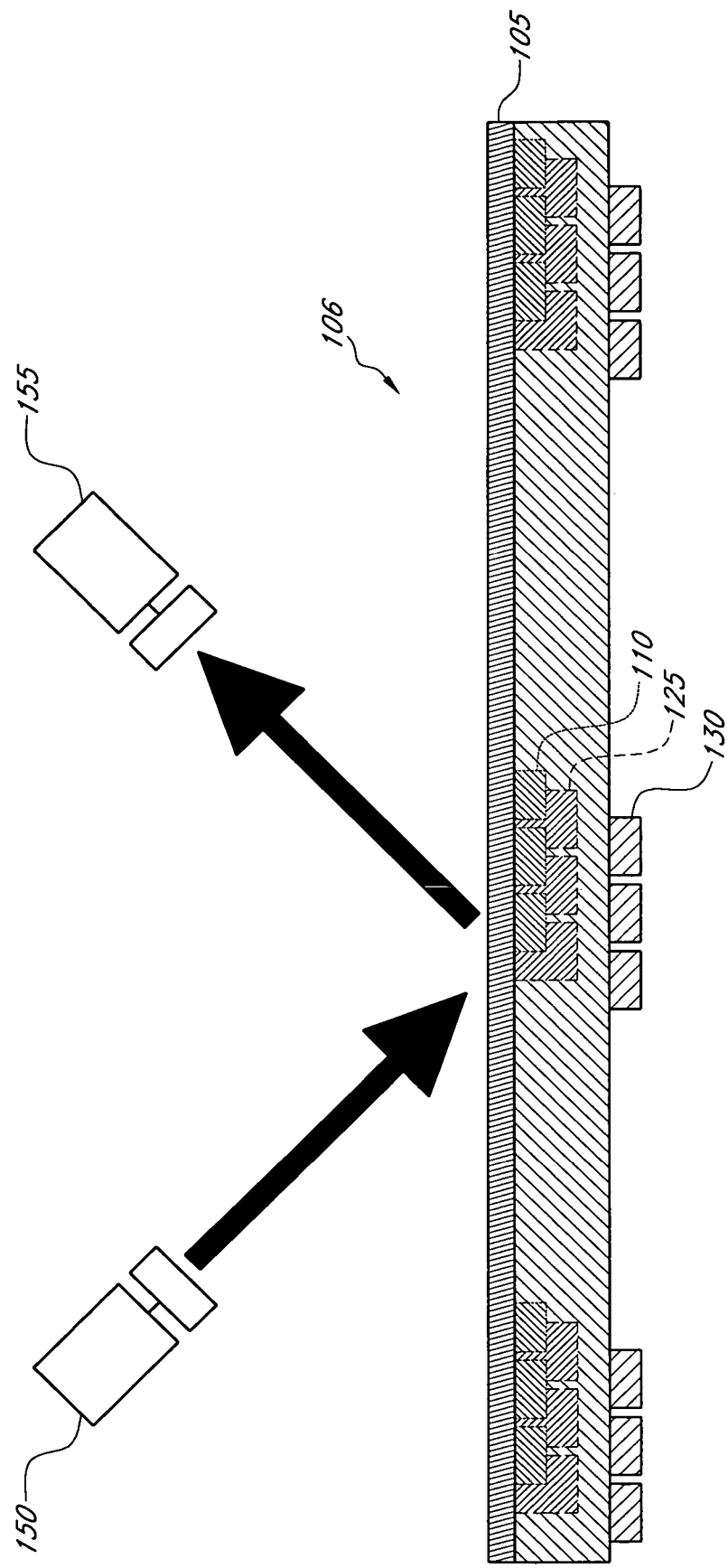

FIG. 1D schematically illustrates the measurement of a parameter of a workpiece 106 associated with example overlay patterns 110, 125, 130 on a substrate 105. Light is directed, for example from an emitter 150, onto the substrate 105 and onto the overlay patterns 110, 125, 130. The light passes through the substrate 105 and is reflected from the overlay patterns 110, 125, 130. The reflected light is detected, for example by a detector 155. In certain embodiments, reflectometry is used to obtain a measure of the parameter of the workpiece 106 from the reflected light. Skilled artisans will recognize that light reflectors on the side of the workpiece 106 facing away from the emitter 150 and detector 155 can be used in the orientation of the workpiece 102 of FIG. 1B to achieve similar results.

Optics for determining the spectral characteristics of light, e.g., the relative intensity of different wavelength components, may also be included in some embodiments. Such optics may comprise a dispersive element such as a grating or a prism. Polarization selective elements (e.g., polarizers, analyzers, etc.) and polarization altering elements (e.g., retarders, etc.) may be included to perform polarization measurements in various embodiments, as well. In certain embodiments, components that alter the angle of incidence of the light directed onto the structure or to alter the angle of collection of light reflected from the structure may be used to determine angle dependency. Other systems and configurations may also be used in different embodiments to assist in performing the optical measurements.

In certain embodiments, reflectometry can be performed on a structure comprising a first overlay pattern and a second overlay pattern over the first overlay pattern. The first overlay pattern comprises a first plurality of features spaced apart from each other. The second overlay pattern comprises a second plurality of features spaced apart from each other. The second plurality of features is offset with respect to and partially overlaps the first plurality of features. See, for example, FIG. 1A. In certain embodiments, the overlay structure further comprises a third overlay pattern over the second overlay pattern. The third overlay pattern comprises a third plurality of features spaced apart from each other. The third plurality of features is offset with respect to and partially overlaps the second plurality of features. See, for example, FIG. 1B. In certain embodiments, the third plurality of features is offset with respect to and partially overlaps the first plurality of features.

As used herein, the term "overlay structure" is to be given its broadest ordinary meaning including, but not limited to, at least one pattern overlying another pattern. The overlay structure may be a test structure, for example formed in the scribe lines or other areas of the workpiece that do not comprise devices. It will be understood that overlay structures formed in scribe lines may be destroyed when the workpiece is scribed along the scribe lines to form individual devices. The overlay structure may also or alternatively be a structure in an area of the workpiece comprising a device. As used herein, the term "overlay pattern" is to be given its broadest ordinary meaning including, but not limited to, a pattern that may be used to determine overlay, critical dimensions, and/or thickness. As used herein, the term "parameter associated with a workpiece" is to be given its broadest ordinary meaning including, but not limited to, overlay, critical dimension, and thickness. As used herein, the parameter term "overlay" is to be given its broadest ordinary meaning including, but not limited to, offset or translation, orthogonality, workpiece rotation, reticle rotation, and/or magnification. In certain embodiments, overlay may be derived from a plurality of overlay structures. As used herein, the parameter term "critical dimension" is to be given its broadest ordinary meaning including, but not limited to, the size of a line or a space.

Figure 2B:
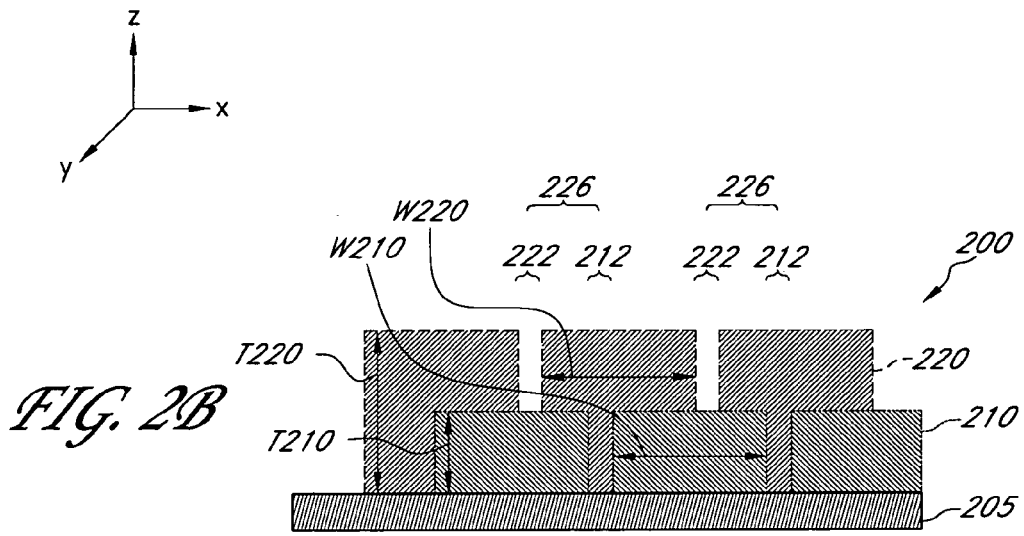
FIG. 2B illustrates a cross-sectional view of the structure of FIG. 2A taken along the line 2B-2B.
Figure 2A:
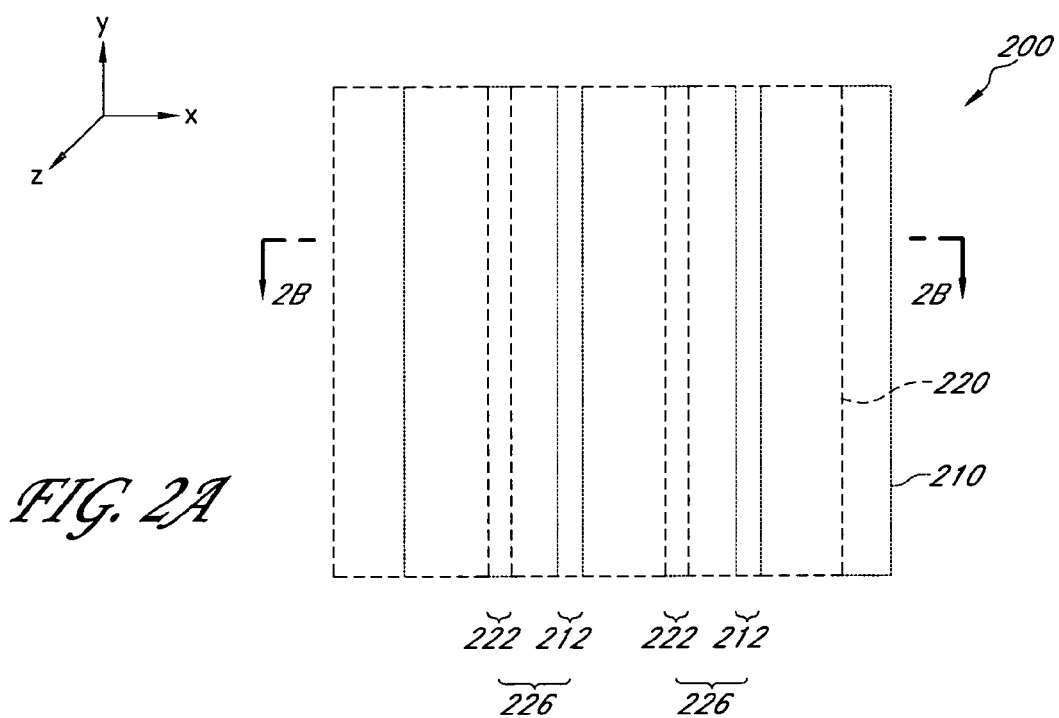
FIG. 2A illustrates a schematic plan view of one embodiment of a multi-layer structure for parameter measurement.

FIG. 2A illustrates a schematic plan view of one embodiment of an overlay structure 200 that can be used for measuring a parameter associated with a semiconductor or reticle workpiece. The overlay structure 200 comprises a first plurality of features 210 and a second plurality of features 220.

The first plurality of features 210, outlined by dotted lines, is formed over a substrate 205 (see FIG. 2B). In certain embodiments, the first plurality of features 210 is formed over a layer above the substrate 205. In the illustrated embodiment, the first plurality of features 210 comprises a first plurality of lines spaced apart from each other by spaces 212.

Preferably, the widths $W_{210}$ of the first plurality of features 210 are wide enough to mitigate toppling, or, more preferably, the widths $W_{210}$ of the first plurality of features 210 are wide enough to substantially prevent toppling. In certain embodiments, the first plurality of features 210 are between about 0.1 and 3 µm, between about 0.3 and 1 µm, or between about 0.45 and 0.5 µm wide. When the first plurality of features 210 are formed on a reticle, the widths $W_{210}$ are generally about four times larger than on a semiconductor workpiece, for example between about 0.4 and 12 µm, between about 1.2 and 4 µm, or between about 1.8 and 2 µm wide. The widths $W_{210}$ of the first plurality of features 210 may be uniform or some features may be wider or thinner than other features.

Preferably, the spaces 212 between the first plurality of features 210 are wide enough to allow deposition within the spaces 212 and are thin enough to capture process variation. In certain embodiments, the first plurality of features 210 are spaced apart between about 50 and 300 nm, between about 100 and 150 nm, or between about 110 and 120 nm. When the first plurality of features 210 are formed on a reticle, the spaces are generally about four times larger than on a semiconductor workpiece, for example between about 200 and 1,200 nm, between about 400 and 600 nm, or between about 440 and 480 nm. The spaces 212 between the first plurality of features 210 may be uniform or some spaces 212 may be wider or thinner than other spaces 212.

Preferably, the thickness $T_{210}$ of the first plurality of features 210 is thin enough to mitigate toppling and thick enough to capture process variation. In certain embodiments, the first plurality of features 210 are between about 30 Å and 8 µm, between about 100 Å and 2 µm, or between about 0.2 µm and 0.6 µm thick. In certain embodiments, the first plurality of features 210 are between about 100 Å and 200 nm, between about 500 Å and 110 nm, or between about 600 Å and 750 Å thick. The thicknesses $T_{210}$ of the first plurality of features 210 may be uniform or some features may be thicker or thinner than other features.

The first plurality of features 210 may comprise any materials or combinations of materials used in semiconductor and reticle manufacturing, including, but not limited to, semiconductors (e.g., silicon, polysilicon), insulators (e.g., quartz, silicon oxide, borophosphosilicate glass (BPSG), molybdenum silicon (e.g., molybdenum-doped silicon oxynitride ($Mo_xSiO_yN_z$), molybdenum-doped silicon oxide (MoSiO))), conductors (e.g., aluminum, copper, chromium, tantalum hafnium), and resist (e.g., photoresist, electron-sensitive material (e.g., FEP-171 from FUJIFILM OLIN Co., Ltd. or EP-009 from Tokyo Ohka Kogyo Co., Ltd.). In certain embodiments, a layer that enhances (e.g., aluminum) or mitigates (e.g., silicon nitride) the reflectivity of the features can be added. In some embodiments, the first plurality of features 210 comprises a plurality of trenches in the substrate 205.

As shown, the first plurality of features 210 may be periodic in certain preferred embodiments. In the illustrated embodiment, the first plurality of features 210 is periodic in one dimension, which in this case is substantially parallel to the x axis, and thus the first plurality of features 210 is said to be periodic along the x axis.

The second plurality of features 220, outlined by dashed lines, is formed over the first plurality of features 210. In the illustrated embodiment, the second plurality of features 220 comprises a second plurality of lines spaced apart from each other by spaces 222.

Preferably, the widths $W_{220}$ of the second plurality of features 220 are wide enough to mitigate toppling, or, more preferably, the widths $W_{220}$ of the second plurality of features 220 are wide enough to substantially prevent toppling. In certain embodiments, the second plurality of features 220 are between about 0.1 and 3 µm, between about 0.3 and 1 µm, or between about 0.45 and 0.5 µm wide. When the second plurality of features 220 are formed on a reticle, the widths $W_{220}$ are generally about four times larger than on a semiconductor workpiece, for example between about 0.4 and 12 µm, between about 1.2 and 4 µm, or between about 1.8 and 2 µm wide. The widths $W_{220}$ of the second plurality of features 220 may be uniform or some features may be wider or thinner than other features. The widths $W_{220}$ of the second plurality of features 220 may be the same as the widths $W_{210}$ of the first plurality of features 210, or the widths $W_{220}$ of the second plurality of features 220 may be wider or thinner than the widths $W_{210}$ of the first plurality of features 210.

Preferably, the spaces 222 between the second plurality of features 220 are wide enough to allow deposition within the spaces 222 and are thin enough to capture process variation. In certain embodiments, the second plurality of features 220 are spaced apart between about 50 and 300 nm, between about 100 and 150 nm, or between about 110 and 120 nm. The spaces 222 between the second plurality of features 220 may be uniform or some spaces 222 may be wider or thinner than other spaces 222. When the second plurality of features 220 are formed on a reticle, the spaces are generally about four times larger than on a semiconductor workpiece, for example between about 200 and 1,200 nm, between about 400 and 600 nm, or between about 440 and 480 nm. The spaces 222 between the second plurality of features 220 may be the same as the spaces 212 between the first plurality of features 210, or the spaces 222 between the second plurality of features 220 may be wider or thinner than the spaces 212 between the first plurality of features 210.

Preferably, the thickness $T_{220}$ of the second plurality of features 220 is thin enough to mitigate toppling and thick enough to capture process variation. In certain embodiments, the second plurality of features 220 are between about 30 Å and 8 µm, between about 100 Å and 2 µm, or between about 0.2 µm and 0.6 µm thick. In certain embodiments, the second plurality of features 220 are between about 100 Å and 200 nm, between about 500 Å and 110 nm, or between about 600 l and 750 Å thick. The thicknesses $T_{220}$ of the second plurality of features 220 may be uniform or some features may be thicker or thinner than other features.

The second plurality of features 220 is offset from the first plurality of features 210 by offset 226. In certain embodiments, the second plurality of features 220 are offset between about 50 and 300 nm, between about 100 and 150 nm, or between about 110 and 120 nm. In some embodiments, the offset 226 is equal to the spaces 212 between the first plurality of features 210 and/or the spaces 222 between the second plurality of features 220. In the illustrated embodiment, the offset 226 is along a first axis (e.g., the axis of the cross-section). The offsets 226 may be uniform or some offsets 226 may be wider or thinner than other offsets 226. As used herein, offsets between pluralities of features may be measured based on the edges of the spaces, the centers of the spaces (e.g., as depicted in FIG. 2A), the edges of the features, the centers of the features, the edges of the spaces to the edges of the features, etc. In the illustrated embodiment, the pluralities of features 210, 220 are periodic in one dimension, which in this case is substantially parallel to the x axis.

In certain embodiments, the widths $W_{210}$ of the first plurality of features 210 are greater than the sum of the spaces 222 between the second plurality of features 220 and the offset 226 between the first plurality of features 210 and the second plurality of features 220. In certain embodiments, the widths $W_{210}$ of the first plurality of features 210 are between about 1.5 and 4 or between about 2 and 3 times greater than the sum of the spaces 222 between the second plurality of features 220 and the offset 226 between the first plurality of features 210 and the second plurality of features 220.

The second plurality of features 220 may comprise, for example, any substantially optically transmissive materials or combinations of substantially optically transmissive features used in semiconductor and reticle manufacturing, including, but not limited to, semiconductors (e.g., silicon, polysilicon), insulators (e.g., quartz, silicon oxide, borophosphosilicate glass (BPSG), molybdenum silicon), thin conductors (e.g., aluminum, copper, chromium, tantalum hafnium), and resist (e.g., photoresist, electron-sensitive material). In certain embodiments, a layer that enhances (e.g., aluminum) or mitigates (e.g., silicon nitride) the reflectivity of the features can be added. The thickness may be sufficient to provide the appropriate amount of optical transmission. The optical transmissivity of the second plurality of features 220 allows light directed on the overlay structure 200 to reflect from both the first plurality of features 210 and the second plurality of features 220.

As shown, the second plurality of features 220 may be periodic in certain preferred embodiments. In the illustrated embodiment, the second plurality of features 220 is periodic in one dimension, which in this case is substantially parallel to the x axis, and thus the second plurality of features 220 is said to be periodic along the x axis.

FIG. 2B is a cross-sectional view of the overlay structure 200 taken along line 2B-2B (parallel to the x direction). In the illustrated embodiment, the second plurality of features 220 fill the spaces 212 between the first plurality of features 210. In some embodiments, other layers or materials fill the spaces 212 between the first plurality of features 210. If the second plurality of features 220 is not aligned properly, the offset 226 may be different from a designed value.

It will be appreciated that a larger number of features may provide increased resolution for some reflectometry techniques, and that a smaller number of features may provide for a reduced size of the overlay structure 200. In certain embodiments, the first plurality of features 210 comprises between about 10 and 500, between about 50 and 100, or between about 70 and 75 features. In certain embodiments, the second plurality of features 220 comprises between about 10 and 500, between about 50 and 100, or between about 70 and 75 features. The second plurality of features 220 may or may not comprise the same number of features as the first plurality of features 210. In certain embodiments, the number of features, feature widths, and spaces between the features are optimized for reflectometry resolution and structure size.

Figure 3B:
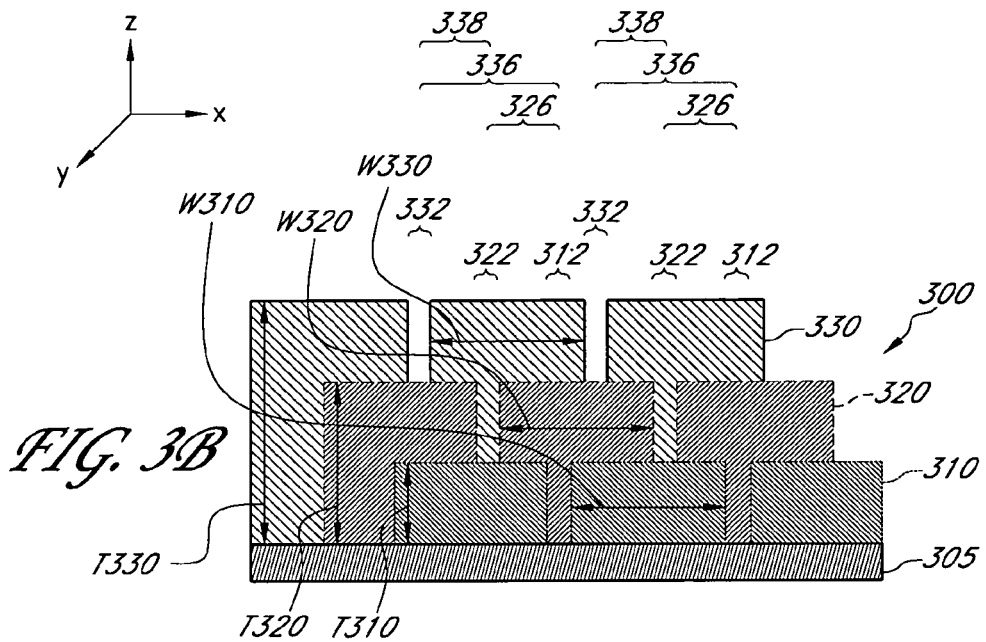
FIG. 3B illustrates a cross-sectional view of the structure of FIG. 3A taken along the line 3B-3B.
Figure 3A:
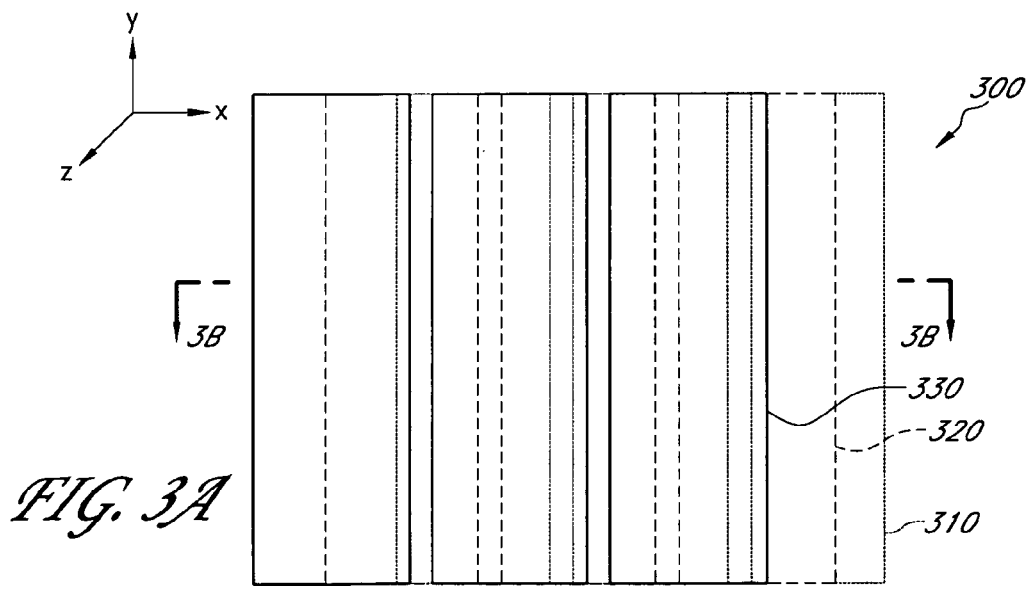
FIG. 3A illustrates a schematic plan view of another embodiment of a multi-layer structure for parameter measurement.

FIG. 3A illustrates a schematic plan view of another embodiment of an overlay structure 300 that can be used for measuring a parameter associated with a semiconductor or reticle workpiece. The first plurality of features 310, outlined by dotted lines, is similar to the first plurality of features 210 described above with respect to FIG. 2A. The second plurality of features 320, outlined by dashed lines, is similar to the second plurality of features 220 described above with respect to FIG. 2A. The overlay structure 300 further comprises a third plurality of features 330, outlined by solid lines, formed over the second plurality of features 320. In the illustrated embodiment, the third plurality of features 330 comprises a third plurality of lines spaced apart from each other by spaces 332.

Preferably, the widths $W_{330}$ of the third plurality of features 330 are wide enough to mitigate toppling, or, more preferably, the widths $W_{330}$ of the third plurality of features 330 are wide enough to substantially prevent toppling. In certain embodiments, the third plurality of features 330 are between about 0.1 and 3 µm, between about 0.3 and 1 µm, or between about 0.45 and 0.5 µm wide. When the third plurality of features 330 are formed on a reticle, the widths $W_{330}$ are generally about four times larger than on a semiconductor workpiece, for example between about 0.4 and 12 µm, between about 1.2 and 4 µm, or between about 1.8 and 2 µm wide. The widths $W_{330}$ of the third plurality of features 330 may be uniform or some features may be wider or thinner than other features. The widths $W_{330}$ of the third plurality of features 330 may be the same as the widths $W_{310}$ of the first plurality of features 310 and/or the widths $W_{320}$ of the second plurality of features 320, or the widths $W_{330}$ of the third plurality of features 330 may be wider or thinner than the widths $W_{310}$ of the first plurality of features 310 and/or the widths $W_{320}$ of the second plurality of features 320.

Preferably, the spaces 332 between the third plurality of features 330 are wide enough to allow deposition within the spaces 332 and are thin enough to capture process variation. In certain embodiments, the third plurality of features 330 are spaced apart between about 50 and 300 nm, between about 100 and 150 nm, or between about 110 and 120 nm. When the third plurality of features 330 are formed on a reticle, the spaces are generally about four times larger than on a semiconductor workpiece, for example between about 200 and 1,200 nm, between about 400 and 600 nm, or between about 440 and 480 nm. The spaces 332 between the third plurality of features 330 may be uniform or some spaces 332 may be wider or thinner than other spaces 332. The spaces 332 between the third plurality of features 330 may be the same as the spaces 312 between the first plurality of features 310 and/or the spaces 322 between the second plurality of features 320, or the spaces 332 between the third plurality of features 330 may be wider or thinner than the spaces 312 between the first plurality of features 310 and/or the spaces 322 between the second plurality of features 320.

The number, width, and spacing of the pluralities of features may be adjusted depending on the number of layers used for multi-layer overlay measurements. For example, the pluralities of features 310, 320, 330 in FIG. 3A may be less numerous, narrower, or spaced more closely together than the pluralities of features 210, 220 in FIG. 2A in order to fit the overlay structures 200, 300 into the same amount of space.

Preferably, the thickness $T_{330}$ of the third plurality of features 330 is thin enough to mitigate toppling and thick enough to capture process variation. In certain embodiments, the third plurality of features 330 are between about 30 Å and 8 µm, between about 100 Å and 2 µm, or between about 0.2 µm and 0.6 µm thick. In certain embodiments, the third plurality of features 330 are between about 100 Å and 200 nm, between about 500 Å and 110 nm, or between about 600 Å and 750 Å thick. The thicknesses $T_{330}$ of the third plurality of features 330 may be uniform or some features may be thicker or thinner than other features.

The third plurality of features 330 is offset from the first plurality of features 310 by offset 336 and is offset from the second plurality of features 320 by offset 338. In some embodiments, the offset 338 is equal to the spaces 312 between the first plurality of features 310, the spaces 322 between the second plurality of features 320, the spaces 332 between the third plurality of features 330, and/or the offset 326. In the illustrated embodiment, the offsets 336, 338 are along a first axis (e.g., the axis of the cross-section). In certain embodiments, the third plurality of features 330 are offset between about 50 and 300 nm, between about 100 and 150 nm, or between about 110 and 120 nm from the second plurality of features 320 and are offset between about 50 and 600 nm, between about 200 and 300 nm, or between about 220 and 240 nm from the first plurality of features 310. In the illustrated embodiment, the offsets 336, 338 are along a first axis (e.g., the x axis). The offsets 336, 338 may be uniform or some offsets 336, 338 may be wider or thinner than other offsets 336, 338.

In certain embodiments, the widths $W_{310}$ of the first plurality of features 310 are greater than the sum of the spaces 322 between the second plurality of features 320, the spaces 332 between the third plurality of features 330, the offset 326 between the first plurality of features 310 and the second plurality of features 320, and the offset 338 between the second plurality of features 320 and the third plurality of features 330. In certain embodiments, the widths $W_{310}$ of the first plurality of features 310 are between about 1.5 and 4 or between about 2 and 3 times greater than the sum of the spaces 322 between the second plurality of features 320, the spaces 332 between the third plurality of features 330, the offset 326 between the first plurality of features 310 and the second plurality of features 320, and the offset 338 between the second plurality of features 320 and the third plurality of features 330.

The third plurality of features 330 may comprise, for example, any substantially optically transmissive materials or combinations of substantially optically transmissive materials used in semiconductor and reticle manufacturing, including, but not limited to, semiconductors (e.g., silicon, polysilicon), insulators (e.g., quartz, silicon oxide, borophosphosilicate glass (BPSG), molybdenum silicon), thin conductors (e.g., aluminum, copper, chromium, tantalum hafnium), and resist (e.g., photoresist, electron-sensitive material). In certain embodiments, a layer that enhances (e.g., aluminum) or mitigates (e.g., silicon nitride) the reflectivity of the features can be added. The thickness may be sufficient to provide the appropriate amount of optical transmission. The optical transmissivity of the third plurality of features 330 allows light directed on the overlay structure 300 to reflect from the first plurality of features 310, the second plurality of features 320, and the third plurality of features 330.

As show, the third plurality of features 330 may be periodic in certain preferred embodiments. In the illustrated embodiment, the pluralities of features 310, 320, 330 are periodic in one dimension, which in this case is substantially parallel to the x axis, and thus the third plurality of features 330 is said to be periodic along the x axis.

FIG. 3B is a cross-sectional view of the overlay structure 300 taken along line 3B-3B (parallel to the x direction). In the illustrated embodiment, the second plurality of features 320 fill the spaces 312 between the first plurality of features 310. In some embodiments, other layers or materials fill the spaces 312 between the first plurality of features 310. If the second plurality of features 320 is not aligned properly, the offsets 326, 338 may be different from designed values. In the illustrated embodiment, the third plurality of features 330 fill the spaces 322 between the second plurality of features 320. In some embodiments, other layers or materials fill the spaces 322 between the second plurality of features 320. If the third plurality of features 330 is not aligned properly, the offsets 336, 338 may be different from designed values.

It will be appreciated that a larger number of features may provide increased resolution for some reflectometry techniques, and that a smaller number of features may provide for a reduced size of the overlay structure 300. In certain embodiments, the first plurality of features 310 comprises between about 10 and 500, between about 50 and 100, or between about 70 and 75 features. In certain embodiments, the second plurality of features 320 comprises between about 10 and 500, between about 50 and 100, or between about 70 and 75 features. In certain embodiments, the third plurality of features 330 comprises between about 10 and 500, between about 50 and 100, or between about 70 and 75 features. The first, second, and third pluralities of features 310, 320, 330, respectively, may or may not comprise the same number of features.

FIG. 4A illustrates a schematic plan view of yet another embodiment of an overlay structure 400 that can be used for measuring a parameter associated with a semiconductor or reticle workpiece. The overlay structure 400 comprises a first plurality of features 410 and a second plurality of features 420.

The first plurality of features 410, outlined by dotted lines, is patterned on a substrate 405 (see FIGS. 4B and 4C). In certain embodiments, the first plurality of features 410 is formed on a layer above the substrate 405. In the illustrated embodiment, the first plurality of features 410 comprises a first plurality of cuboids spaced apart from each other by spaces 412, 413. As used herein, the term "cuboid" is to be given its broadest possible meaning including, but not limited to, polygonal, rhombus, trapezoid, rectangular, and square cross-sectional shapes with substantially squared or rounded corners and with perpendicular or angled sides.

Preferably, the widths $W_{410}$ and lengths $L_{410}$ of the first plurality of features 410 are wide and long enough to mitigate toppling, or, more preferably, the widths $W_{410}$ and lengths $L_{410}$ of the first plurality of features 410 are wide and long enough to substantially prevent toppling. In certain embodiments, the first plurality of features 410 are between about 0.1 and 3 µm, between about 0.3 and 1 µm, or between about 0.45 and 0.5 µm wide. When the first plurality of features 410 are formed on a reticle, the widths $W_{410}$ are generally about four times larger than on a semiconductor workpiece, for example between about 0.4 and 12 µm, between about 1.2 and 4 µm, or between about 1.8 and 2 µm wide. The widths $W_{410}$ of the first plurality of features 410 may be uniform or some features may be wider or thinner than other features. In certain embodiments, the first plurality of features 410 are between about 0.1 and 3 µm, between about 0.3 and 1 µm, or between about 0.45 and 0.5 µm long. When the first plurality of features 410 are formed on a reticle, the lengths $L_{410}$ are generally about four times larger than on a semiconductor workpiece, for example between about 0.4 and 12 µm, between about 1.2 and 4 µm, or between about 1.8 and 2 µm long. The lengths $L_{410}$ of the first plurality of features 410 may be uniform or some features may be longer or shorter than other features. The widths $W_{410}$ of the first plurality of features 410 may be the same as the lengths $L_{410}$ of the first plurality of features 410 (e.g., to form substantially square cross-sectional features) or the widths $W_{410}$ of the first plurality of features 410 may be different from the lengths $L_{410}$ of the first plurality of features 410.

Preferably, the spaces 412, 413 between the first plurality of features 410 are wide enough to allow deposition within the spaces 412, 413 and are thin enough to capture process variation. In certain embodiments, the first plurality of features 410 are spaced apart between about 50 and 300 nm, between about 100 and 150 nm, or between about 110 and 120 nm. When the first plurality of features 410 are formed on a reticle, the spaces are generally about four times larger than on a semiconductor workpiece, for example between about 200 and 1,200 nm, between about 400 and 600 nm, or between about 440 and 480 nm. The spaces 412 between the first plurality of features 410 may be uniform or some spaces 412 may be wider or thinner than other spaces 412. The spaces 413 between the first plurality of features 410 may be uniform or some spaces 413 may be wider or thinner than other spaces 413. The spaces 412 between the first plurality of features 410 may be the same as the spaces 413 between the first plurality of features 410 or the spaces 412 may be wider or thinner than the spaces 413.

Preferably, the thickness $T_{410}$ of the first plurality of features 410 is thin enough to mitigate toppling and thick enough to capture process variation. In certain embodiments, the first plurality of features 410 are between about 30 Å and 8 µm, between about 100 Å and 2 µm, or between about 0.2 µm and 0.6 µm thick. In certain embodiments, the first plurality of features 410 are between about 100 Å and 200 nm, between about 500 Å and 110 nm, or between about 600 Å and 750 Å thick. The thicknesses $T_{410}$ of the first plurality of features 410 may be uniform or some features may be thicker or thinner than other features.

The first plurality of features 410 may comprise, for example, any materials or combinations of materials used in semiconductor and reticle manufacturing, including, but not limited to, semiconductors (e.g., silicon, polysilicon), insulators (e.g., quartz, silicon oxide, borophosphosilicate glass (BPSG), molybdenum silicon), conductors (e.g., aluminum, copper, chromium, tantalum hafnium), and resist (e.g., photoresist, electron-sensitive material). In certain embodiments, a layer that enhances (e.g., aluminum) or mitigates (e.g., silicon nitride) the reflectivity of the features can be added. In some embodiments, the first plurality of features 410 comprises trenches in the substrate 405.

As shown, the first plurality of features 410 may be periodic in certain preferred embodiments. In the illustrated embodiment, the plurality of features 410 is periodic in two dimensions, which in this case are substantially parallel to each of the x and y axes, and thus the first plurality of features 410 is said to be periodic along the x and y axes.

The second plurality of features 420, outlined by dashed lines, is formed over the first plurality of features 410. In the illustrated embodiment, the second plurality of features 420 comprises a second plurality of cuboids spaced apart from each other by spaces 422, 423.

Preferably, the widths $W_{420}$ and lengths $L_{420}$ of the second plurality of features 420 are wide and long enough to mitigate toppling, or, more preferably, the widths $W_{420}$ and lengths $L_{420}$ of the second plurality of features 420 are wide and long enough to substantially prevent toppling. In certain embodiments, the second plurality of features 420 are between about 0.1 and 3 µm, between about 0.3 and 1 µm, or between about 0.45 and 0.5 µm wide. When the second plurality of features 420 are formed on a reticle, the widths $W_{420}$ are generally about four times larger than on a semiconductor workpiece, for example between about 0.4 and 12 µm, between about 1.2 and 4 µm, or between about 1.8 and 2 µm wide. The widths $W_{420}$ of the second plurality of features 420 may be uniform or some features may be wider or thinner than other features. The widths $W_{420}$ of the second plurality of features 420 may be the same as the widths $W_{410}$ of the first plurality of features 410, or the widths $W_{420}$ of the second plurality of features 420 may be wider or thinner than the widths $W_{410}$ of the first plurality of features 410. In certain embodiments, the second plurality of features 420 are between about 0.1 and 3 µm, between about 0.3 and 1 µm, or between about 0.45 and 0.5 µm long. When the second plurality of features 420 are formed on a reticle, the lengths $L_{420}$ are generally about four times larger than on a semiconductor workpiece, for example between about 0.4 and 12 µm, between about 1.2 and 4 µm, or between about 1.8 and 2 µm long. The lengths $L_{420}$ of the second plurality of features 420 may be uniform or some features may be longer or shorter than other features. The lengths $L_{420}$ of the second plurality of features 420 may be the same as the lengths $L_{410}$ of the first plurality of features 410, or the lengths $L_{420}$ of the second plurality of features 420 may be the longer or shorter than the lengths $L_{410}$ of the first plurality of features 410. The widths $W_{420}$ of the second plurality of features 420 may be the same as the lengths $L_{420}$ of the second plurality of features 420 (e.g., to form substantially square cross-sectional features) or the widths $W_{420}$ of the second plurality of features 420 may be different from the lengths $L_{420}$ of the second plurality of features 420.

Preferably, the spaces 422, 423 between the second plurality of features 420 are wide enough to allow deposition within the spaces 422, 423 and are thin enough to capture process variation. In certain embodiments, the second plurality of features 420 are spaced apart between about 50 and 300 nm, between about 100 and 150 nm, or between about 110 and 120 nm. When the second plurality of features 420 are formed on a reticle, the spaces are generally about four times larger than on a semiconductor workpiece, for example between about 200 and 1,200 nm, between about 400 and 600 nm, or between about 440 and 480 nm. The spaces 422 between the second plurality of features 420 may be uniform or some spaces 422 may be wider or thinner than other spaces 422. The spaces 423 between the second plurality of features 420 may be uniform or some spaces 423 may be wider or thinner than other spaces 423. The spaces 422 between the second plurality of features 420 may be the same as the spaces 423 between the second plurality of features 420 or the spaces 422 may be wider or thinner than the spaces 423. The spaces 422, 423 between the second plurality of features 420 may be the same as the spaces 412, 413 between the first plurality of features 410, or the spaces 422, 423 between the second plurality of features 420 may be wider or thinner than the spaces 412, 413 between the first plurality of features 410.

Preferably, the thickness $T_{420}$ of the second plurality of features 420 is thin enough to mitigate toppling and thick enough to capture process variation. In certain embodiments, the second plurality of features 420 are between about 30 Å and 8 µm, between about 100 Å and 2 µm, or between about 0.2 µm and 0.6 µm thick. In certain embodiments, the second plurality of features 420 are between about 100 Å and 200 nm, between about 500 Å and 110 nm, or between about 600 Å and 750 Å thick. The thicknesses $T_{420}$ of the second plurality of features 420 may be uniform or some features may be thicker or thinner than other features.

The second plurality of features 420 is offset from the first plurality of features 410 by offsets 426, 427. In certain embodiments, the second plurality of features 420 are offset between about 50 and 300 nm, between about 100 and 150 nm, or between about 110 and 120 nm. In the illustrated embodiment, the offsets 426, 427 are along first and second non-parallel axes (e.g., x and y axes). The offsets 426, 427 may be uniform or some offsets 426, 427 may be wider or thinner than other offsets 426, 427. In the illustrated embodiment, the pluralities of features 410, 420 are periodic in two dimensions and form rows and columns parallel to the x and y axes. The periodic spacing in two dimensions allows for parameters in two dimensions to be measured on the same overlay structure. For example, overlay and critical dimensions in the x and y directions can be measured on the same overlay structure at the same time.

The second plurality of features 420 may comprise, for example, any substantially optically transmissive materials or combinations of substantially optically transmissive features used in semiconductor and reticle manufacturing, including, but not limited to, semiconductors (e.g., silicon, polysilicon), insulators (e.g., silicon oxide, borophosphosilicate glass (BPSG)), thin conductors (e.g., aluminum, copper), and resist (e.g., photoresist, electron-sensitive material). In certain embodiments, a layer that enhances (e.g., aluminum) or mitigates (e.g., silicon nitride) the reflectivity of the features can be added. The thickness may be sufficient to provide the appropriate amount of optical transmission. The optical transmissivity of the second plurality of features 420 allows light directed on the overlay structure 400 to reflect from both the first plurality of features 410 and the second plurality of features 420.

FIG. 4B is a cross-sectional view of the overlay structure 400 taken along line 4B-4B (parallel to the x direction). In the illustrated embodiment, the second plurality of features 420 fill the spaces 412 between the first plurality of features 410. In some embodiments, other layers or materials fill the spaces 412 between the first plurality of features 410. If the second plurality of features 420 is not aligned properly, the offsets 426 may be different from designed values.

FIG. 4C is a cross-sectional view of the overlay structure 400 taken along line 4C-4C (parallel to the y direction). In the illustrated embodiment, the second plurality of features 420 fill the spaces 413 between the first plurality of features 410. In some embodiments, other layers or materials fill the spaces 413 between the first plurality of features 410. If the second plurality of features 420 is not aligned properly, the offsets 427 may be different from designed values.

It will be appreciated that a larger number of features may provide increased resolution for some techniques, and that a smaller number of features may provide for a reduced size of the overlay structure 400. In certain embodiments, the first plurality of features 410 comprises between about 100 and 250,000, between about 2,500 and 10,000, or between about 4,900 and 5,625 features. The first plurality of features 410 may or may not comprise the same numbers of features along substantially non-parallel axes. In certain embodiments, the second plurality of features 420 comprises between about 100 and 250,000, between about 2,500 and 10,000, or between about 4,900 and 5,625 features. The second plurality of features 420 may or may not comprise the same numbers of features along substantially non-parallel axes. The second plurality of features 420 may or may not comprise the same numbers of features as the first plurality of features 410.

Figure 5B:
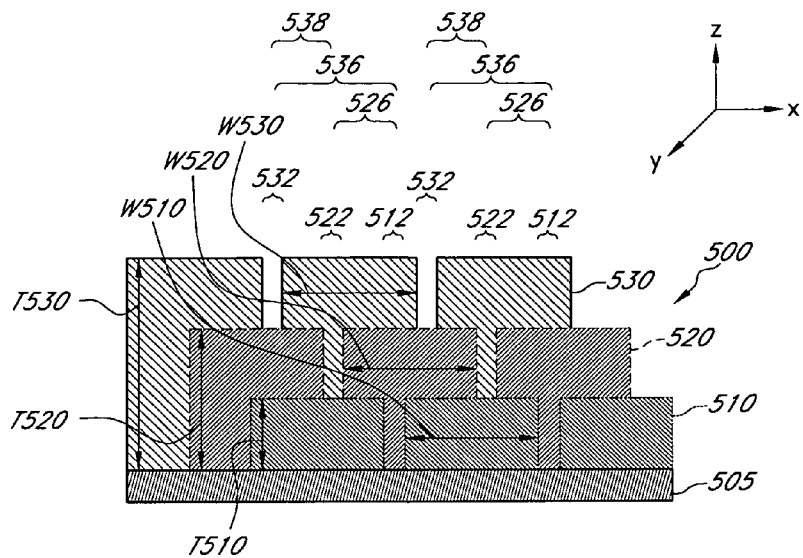
FIG. 5B illustrates a cross-sectional view of the structure of FIG. 5A taken along the line 5B-5B.
Figure 5A:
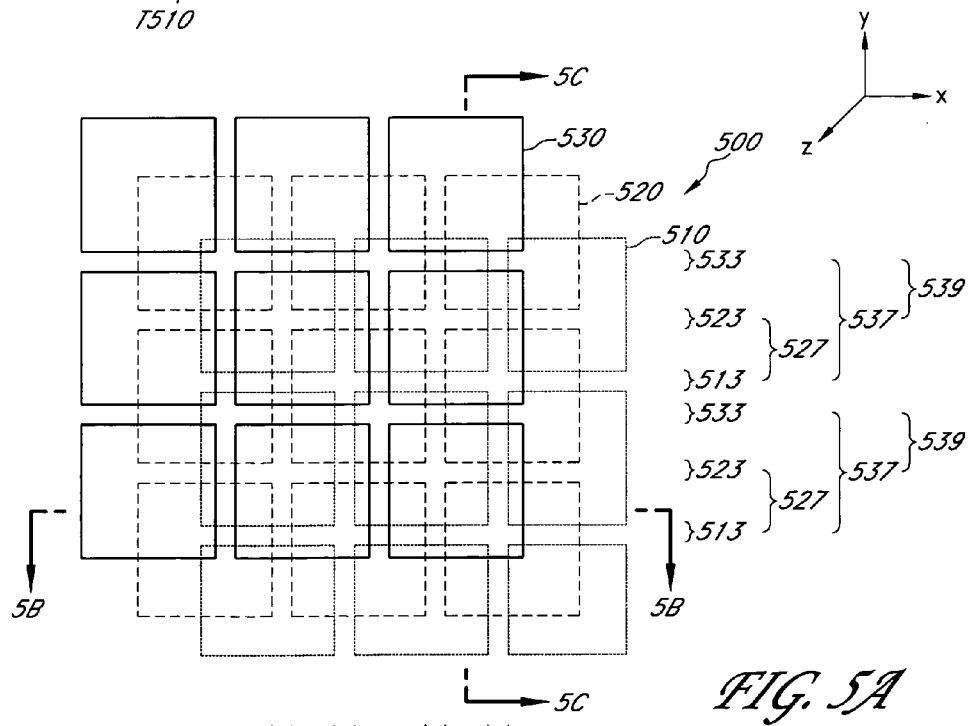
FIG. 5A illustrates a schematic plan view of still yet another embodiment of a multi-layer structure for parameter measurement.

FIG. 5A illustrates a schematic plan view of still another embodiment of an overlay structure 500 that can be used for measuring a parameter associated with a semiconductor or reticle workpiece. The first plurality of features 510, outlined by dotted lines, is similar to the first plurality of features 410 described above with respect to FIG. 4A. The second plurality of features 520, outlined by dashed lines, is similar to the second plurality of features 420 described above with respect to FIG. 4A. The overlay structure 500 further comprises a third plurality of features 530, outlined by solid lines, formed on the second plurality of features 520. In the illustrated embodiment, the third plurality of features 530 comprises a third plurality of cuboids spaced apart from each other by spaces 532, 533.

Preferably, the widths $W_{530}$ and lengths $L_{530}$ of the third plurality of features 530 are wide and long enough to mitigate toppling, or, more preferably, the widths $W_{530}$ and lengths $L_{530}$ of the third plurality of features 530 are wide and long enough to substantially prevent toppling. In certain embodiments, the third plurality of features 530 are between about 0.1 and 3 µm, between about 0.3 and 1 µm, or between about 0.45 and 0.5 µm wide. When the third plurality of features 530 are formed on a reticle, the widths $W_{530}$ are generally about four times larger than on a semiconductor workpiece, for example between about 0.4 and 12 µm, between about 1.2 and 4 µm, or between about 1.8 and 2 µm wide. The widths $W_{530}$ of the third plurality of features 530 may be uniform or some features may be wider or thinner than other features. The widths $W_{530}$ of the third plurality of features 530 may be the same as the widths $W_{510}$ of the first plurality of features 510 and/or the widths $W_{520}$ of the second plurality of features 520, or the widths $W_{530}$ of the third plurality of features 530 may be wider or thinner than the widths $W_{510}$ of the first plurality of features 510 and/or the widths $W_{520}$ of the second plurality of features 520. In certain embodiments, the third plurality of features 530 are between about 0.1 and 3 µm, between about 0.3 and 1 µm, or between about 0.45 and 0.5 µm long. When the third plurality of features 530 are formed on a reticle, the lengths $L_{530}$ are generally about four times larger than on a semiconductor workpiece, for example between about 0.4 and 12 µm, between about 1.2 and 4 µm, or between about 1.8 and 2 µm long. The lengths $L_{530}$ of the third plurality of features 530 may be uniform or some features may be longer or shorter than other features. The lengths $L_{530}$ of the third plurality of features 530 may be the same as the lengths $L_{510}$ of the first plurality of features 510 and/or the lengths $L_{520}$ of the second plurality of features 520, or the lengths $L_{530}$ of the third plurality of features 530 may be the longer or shorter than the lengths $L_{510}$ of the first plurality of features 510 and/or the lengths $L_{520}$ of the second plurality of features 520. The widths $W_{530}$ of the third plurality of features 530 may be the same as the lengths $L_{530}$ of the third plurality of features 530 (e.g., to form substantially square cross-sectional features) or the widths $W_{530}$ of the third plurality of features 530 may be different from the lengths $L_{530}$ of the third plurality of features 530.

Preferably, the spaces 532, 533 between the third plurality of features 530 are wide enough to allow deposition within the spaces 532, 533 and are thin enough to capture process variation. In certain embodiments, the third plurality of features 530 are spaced apart between about 50 and 300 nm, between about 100 and 150 nm, or between about 110 and 120 nm. When the third plurality of features 530 are formed on a reticle, the spaces are generally about four times larger than on a semiconductor workpiece, for example between about 200 and 1,200 nm, between about 400 and 600 nm, or between about 440 and 480 nm. The spaces 532 between the third plurality of features 530 may be uniform or some spaces 532 may be wider or thinner than other spaces 532. The spaces 533 between the third plurality of features 530 may be uniform or some spaces 533 may be wider or thinner than other spaces 533. The spaces 532 between the third plurality of features 530 may be the same as the spaces 533 between the third plurality of features 530 or the spaces 532 may be wider or thinner than the spaces 533. The spaces 532, 533 between the third plurality of features 530 may be the same as the spaces 512, 513 between the first plurality of features 510 and/or the spaces 522, 523 between the second plurality of features 520, or the spaces 532, 533 between the third plurality of features 530 may be wider or thinner than the spaces 512, 513 between the first plurality of features 510 and/or the spaces 522, 523 between the second plurality of features 520.

The number, widths, lengths, and spacings of the pluralities of features may be adjusted depending on the number of layers used for multi-layer overlay measurements. For example, the pluralities of features 510, 520, 530 in FIG. 5A may be less numerous, thinner, shorter, and spaced closer together than the pluralities of features 410, 420 in FIG. 4A in order to fit the overlay structures 400, 500 into the same amount of space.

Preferably, the thickness $T_{530}$ of the third plurality of features 530 is thin enough to mitigate toppling and thick enough to capture process variation. In certain embodiments, the third plurality of features 530 are between about 30 Å and 8 µm, between about 100 Å and 2 µm, or between about 0.2 µm and 0.6 µm thick. In certain embodiments, the third plurality of features 530 are between about 100 Å and 200 nm, between about 500 Å and 110 nm, or between about 600 Å and 750 Å thick. The thicknesses $T_{530}$ of the third plurality of features 530 may be uniform or some features may be thicker or thinner than other features.

The third plurality of features 530 is offset from the first plurality of features 510 by offsets 536, 537 and is offset from the second plurality of features 520 by offsets 538, 539. In certain embodiments, the third plurality of features 530 are offset between about 100 and 600 nm, between about 200 and 300 nm, or between about 220 and 240 nm from the first plurality of features 510 and are offset between about 50 and 300 nm, between about 100 and 150 nm, or between about 110 and 120 nm from the second plurality of features 520. In the illustrated embodiment, the offsets 536, 537, 538, 539 are along first and second substantially non-parallel axes (e.g., the x and y axes). The offsets 536, 537, 538, 539 may be uniform or some offsets 536, 537, 538, 539 may be wider or thinner than other offsets 536, 537, 538, 539. In the illustrated embodiment, the pluralities of features 510, 520, 530 are periodic in two dimensions and form rows and columns parallel to the x and y axes. The periodic spacing in two dimensions allows for parameters in two dimensions to be measured on the same overlay structure. For example, overlay and critical dimensions in the x and y directions can be measured on the same overlay structure at the same time.

The third plurality of features 530 may comprise, for example, any substantially optically transmissive materials or combinations of substantially optically transmissive materials used in semiconductor and reticle manufacturing, including, but not limited to, semiconductors (e.g., silicon, polysilicon), insulators (e.g., quartz, silicon oxide, borophosphosilicate glass (BPSG), molybdenum silicon), thin conductors (e.g., aluminum, copper, chromium, tantalum hafnium), and resist (e.g., photoresist, electron-sensitive material). In certain embodiments, a layer that enhances (e.g., aluminum) or mitigates (e.g., silicon nitride) the reflectivity of the features can be added. The thickness may be sufficient to provide the appropriate amount of optical transmission. The optical transmissivity of the third plurality of features 530 allows light directed on the overlay structure 500 to reflect from the first plurality of features 510, the second plurality of features 520, and the third plurality of features 530.

FIG. 5B is a cross-sectional view of the overlay structure 500 taken along line 5B-5B. In the illustrated embodiment, the second plurality of features 520 fill the spaces 512 between the first plurality of features 510. In some embodiments, other layers or materials fill the spaces 512 between the first plurality of features 510. If the second plurality of features 520 is not aligned properly, the offsets 526, 538 may be different from designed values. In the illustrated embodiment, the third plurality of features 530 fill the spaces 522 between the second plurality of features 520. In some embodiments, other layers or materials fill the spaces 522 between the second plurality of features 520. If the third plurality of features 530 is not aligned properly, the offsets 536, 538 may be different from designed values.

Figure 5C:
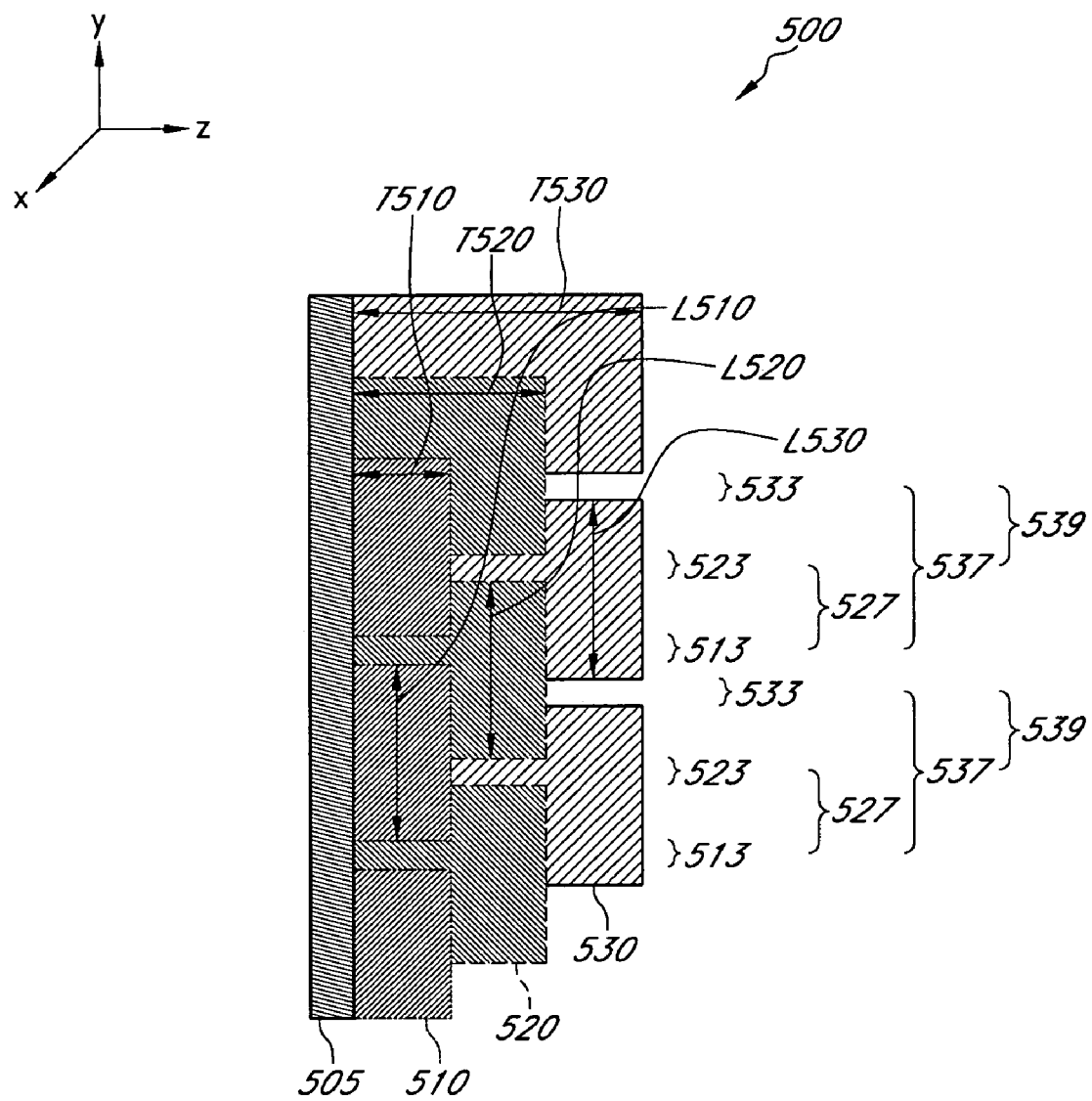
FIG. 5C illustrates a cross-sectional view of the structure of FIG. 5A taken along the line 5C-5C.

FIG. 5C is a cross-sectional view of the overlay structure 500 taken along line 5C-5C. In the illustrated embodiment, the second plurality of features 520 fill the spaces 513 between the first plurality of features 510. In some embodiments, other layers or materials fill the spaces 513 between the first plurality of features 510. If the second plurality of features 520 is not aligned properly, the offsets 527, 539 may be different from designed values. In the illustrated embodiment, the third plurality of features 530 fill the spaces 523 between the second plurality of features 520. In some embodiments, other layers or materials fill the spaces 523 between the second plurality of features 520. If the third plurality of features 530 is not aligned properly, the offsets 537, 539 may be different from designed values.

It will be appreciated that a larger number of features may provide increased resolution for some reflectometry techniques, and that a smaller number of features may provide for a reduced size of the overlay structure 500. In certain embodiments, the first plurality of features 510 comprises between about 100 and 250,000, between about 2,500 and 10,000, or between about 4,900 and 5,625 features. The first plurality of features 510 may or may not comprise the same number of features along substantially non-parallel axes. In certain embodiments, the second plurality of features 520 comprises between about 100 and 250,000, between about 2,500 and 10,000, or between about 4,900 and 5,625 features. The second plurality of features 520 may or may not comprise the same number of features along substantially non-parallel axes. In certain embodiments, the third plurality of features 530 comprises between about 100 and 250,000, between about 2,500 and 10,000, or between about 4,900 and 5,625 features. The third plurality of features 530 may or may not comprise the same number of features along substantially non-parallel axes. The first, second, and third pluralities of features 510, 520, 530, respectively, may or may not comprise the same number of features.

Figure 6B:
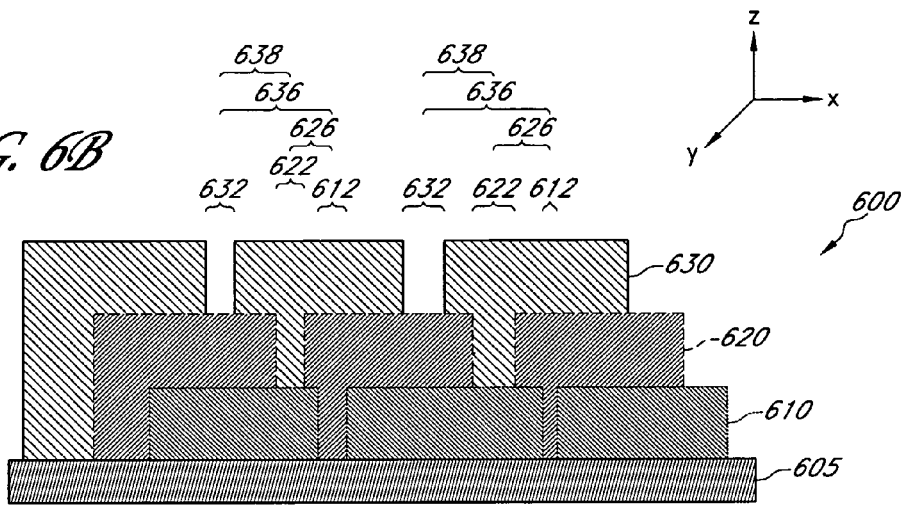
FIG. 6B illustrates a cross-sectional view of the structure of FIG. 6A taken along the line 6B-6B.
Figure 6A:
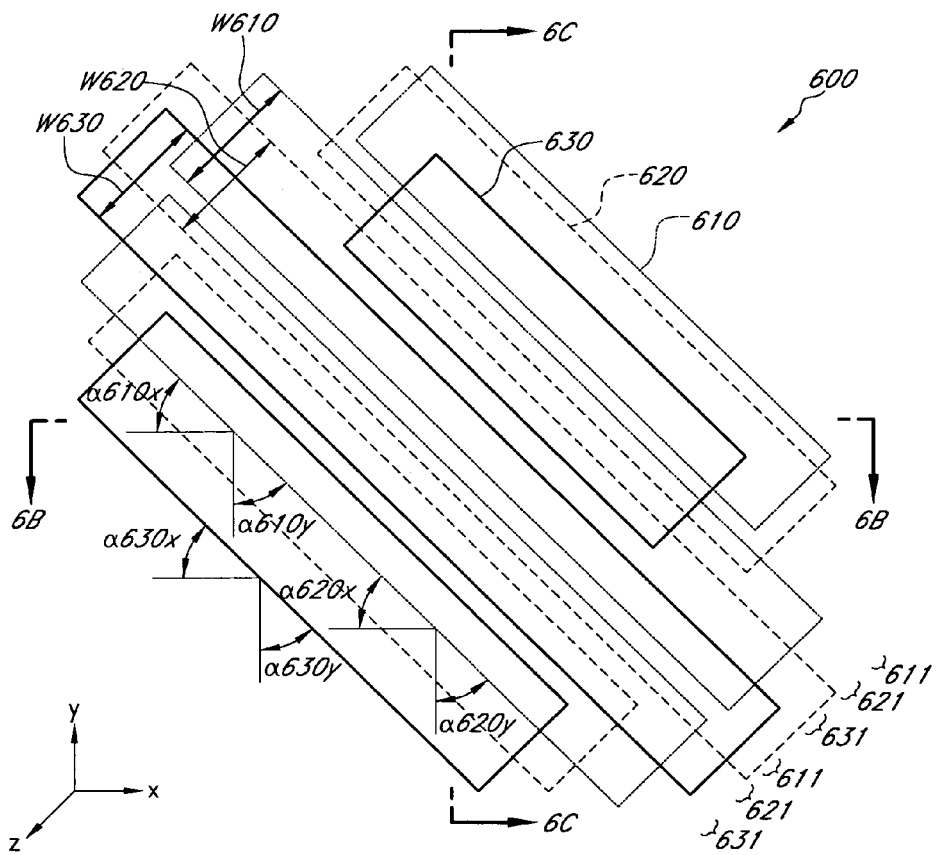
FIG. 6A illustrates a schematic plan view of a further embodiment of a multi-layer structure for parameter measurement.

FIG. 6A illustrates a schematic plan view of yet still another embodiment of an overlay structure 600 that can be used for measuring a parameter associated with a semiconductor or reticle workpiece. The overlay structure 600 is similar to the overlay structure 300 depicted in FIG. 3A, except the pluralities of features 610, 620, 630 are angled with respect to the scribe lines within which or between which the overlay structure 600 is formed by angles $\alpha_{610x}$, $\alpha_{610y}$, $\alpha_{620x}$, $\alpha_{620y}$, $\alpha_{630x}$, and $\alpha_{630y}$. The angles $\alpha_{610x}$, $\alpha_{610y}$ of the first plurality of features 610 may be uniform or some angles may be more acute or obtuse than other angles. The angles $\alpha_{620x}$, $\alpha_{620y}$ of the second plurality of features 620 may be uniform or some angles may be more acute or obtuse than other angles. The angles $\alpha_{630x}$, $\alpha_{630y}$ of the third plurality of features 630 may be uniform or some angles may be more acute or obtuse than other angles. The angles $\alpha_{620x}$, $\alpha_{620y}$ of the second plurality of features 620 may be the same as the angles $\alpha_{610x}$, $\alpha_{610y}$ of the first plurality of features 610, or the angles $\alpha_{620x}$, $\alpha_{620y}$ of the second plurality of features 620 may be more acute or obtuse than the angles $\alpha_{610x}$, $\alpha_{610y}$ of the first plurality of features 610. The angles $\alpha_{630x}$, $\alpha_{630y}$ of the third plurality of features 630 may be the same as the angles $\alpha_{610x}$, $\alpha_{610y}$ of the first plurality of features 610 and/or the angles $\alpha_{620x}$, $\alpha_{620y}$ of the second plurality of features 620, or the angles $\alpha_{630x}$, $\alpha_{630y}$ of the third plurality of features 630 may be more acute or obtuse than the angles $\alpha_{610x}$, $\alpha_{610y}$ of the first plurality of features 610 and/or the angles $\alpha_{620x}$, $\alpha_{620y}$ of the second plurality of features 620.

In the illustrated embodiment, the pluralities of features 610, 620, 630 are periodic in one dimension, for example because the features are substantially parallel. Although periodically spaced in one dimension, the angles allow for parameters in two dimensions to be measured on the same overlay structure. For example, overlay and critical dimensions in the x and y directions can be measured on the same overlay structure by rotating the workpiece.

FIG. 6B is a cross-sectional view of the overlay structure 600 taken along line 6B-6B, which is substantially parallel or perpendicular to the scribe lines within which or between which the overlay structure 600 is formed. As in FIG. 5B, the pluralities of features 610, 620, 630 are spaced apart from each other in the x direction. In the illustrated embodiment, the second plurality of features 620 fill the spaces 611, and thus the spaces 612, between the first plurality of features 610. In some embodiments, other layers or materials fill the spaces 611, 612 between the first plurality of features 610. If the second plurality of features 620 is not aligned properly, the offsets 626, 638 may be different from designed values. In the illustrated embodiment, the third plurality of features 630 fill the spaces 621, and thus the spaces 622, between the second plurality of features 620. In some embodiments, other layers or materials fill the spaces 621, 622 between the second plurality of features 620. If the third plurality of features 630 is not aligned properly, the offsets 636, 638 may be different from designed values.

Figure 6C:
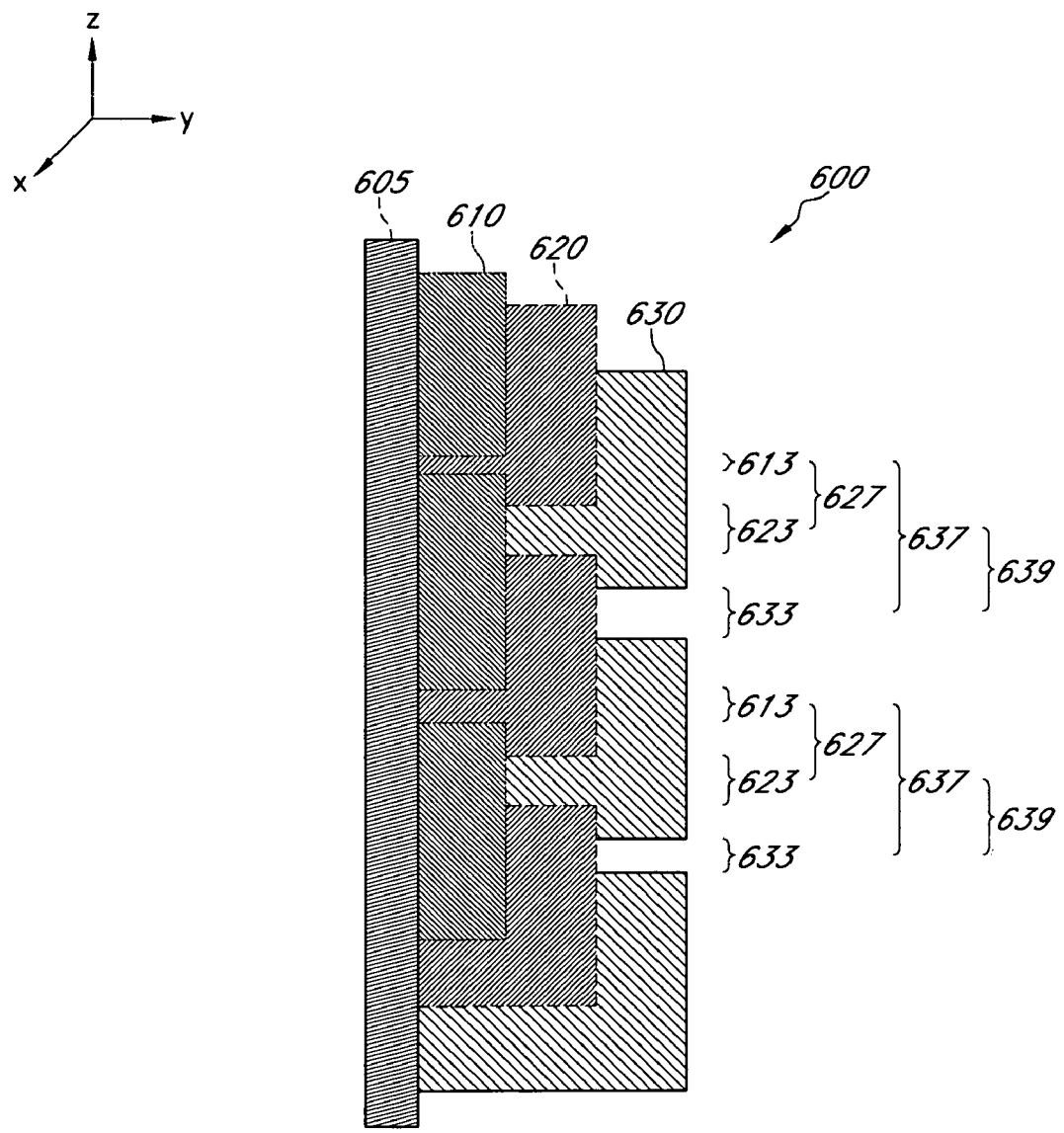
FIG. 6C illustrates a cross-sectional view of the structure of FIG. 6A taken along the line 6C-6C.

FIG. 6C is a cross-sectional view of the overlay structure 600 taken along line 6C-6C, which is substantially parallel or perpendicular to the scribe lines within which or between which the overlay structure 600 is formed, and which is substantially perpendicular to the line 6B-6B. As in FIG. 5C, the pluralities of features 610, 620, 630 are spaced apart from each other in the y direction. In the illustrated embodiment, the second plurality of features 620 fill the spaces 611, and thus the spaces 613, between the first plurality of features 610. In some embodiments, other layers or materials fill the spaces 611, 613 between the first plurality of features 610. If the second plurality of features 620 is not aligned properly, the offsets 627, 639 may be different from designed values. In the illustrated embodiment, the third plurality of features 630 fill the spaces 621, and thus the spaces 623, between the second plurality of features 620. In some embodiments, other layers or materials fill the spaces 621, 623 between the second plurality of features 620. If the third plurality of features 630 is not aligned properly, the offsets 637, 639 may be different from designed values.

Figure 7B:
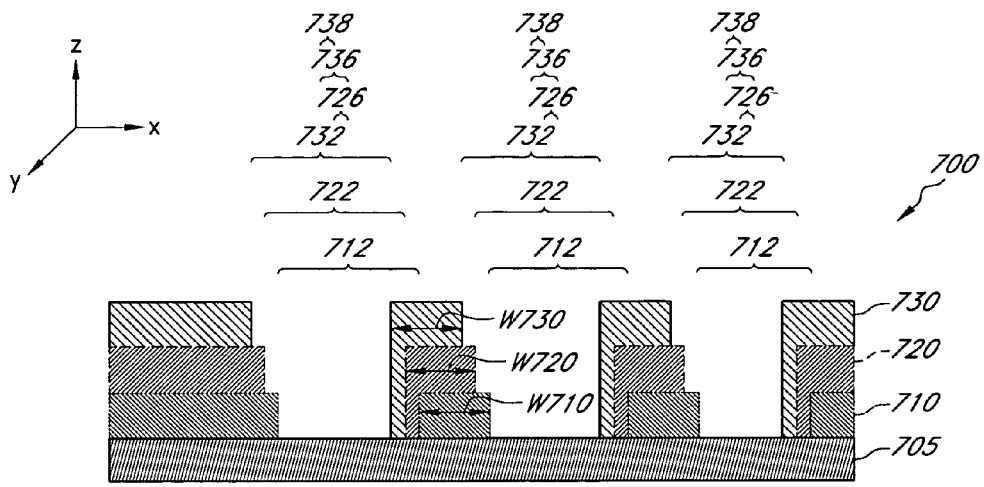
FIG. 7B illustrates a cross-sectional view of the structure of FIG. 7A taken along the line 7B-7B.
Figure 7A:
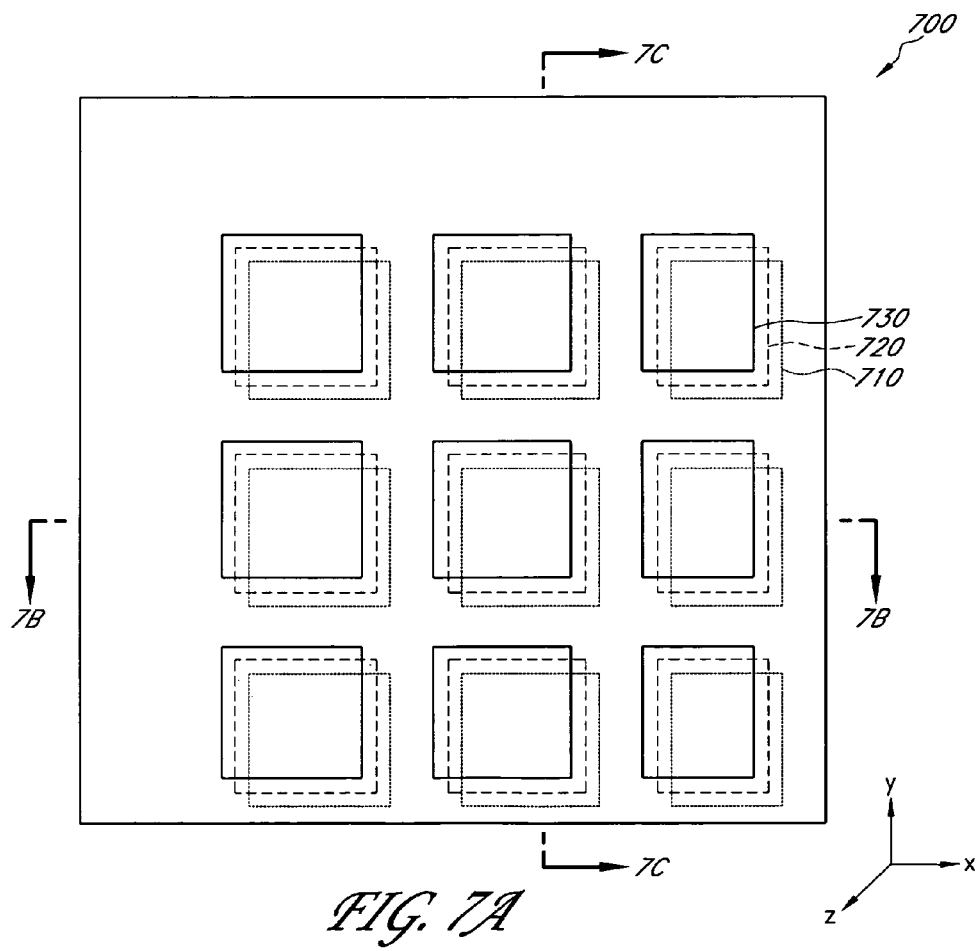
FIG. 7A illustrates a schematic plan view of a yet further embodiment of a multi-layer structure for parameter measurement.

FIG. 7A illustrates a schematic plan view of another embodiment of an overlay structure 700 that can be used for measuring a parameter associated with a semiconductor or reticle workpiece. The overlay structure 700 is similar to the overlay structure 500 depicted in FIG. 5A, except the second plurality of features 720 does not fill the spaces 712, 713 between the first plurality of features 710 and the third plurality of features 720 does not fill the spaces 722, 723 between the second plurality of features 720. Measurement of the overlay structure 700 may require different data analysis and transformation than measurement of the overlay structure 500, for example by using a different library.

Figure 7C:
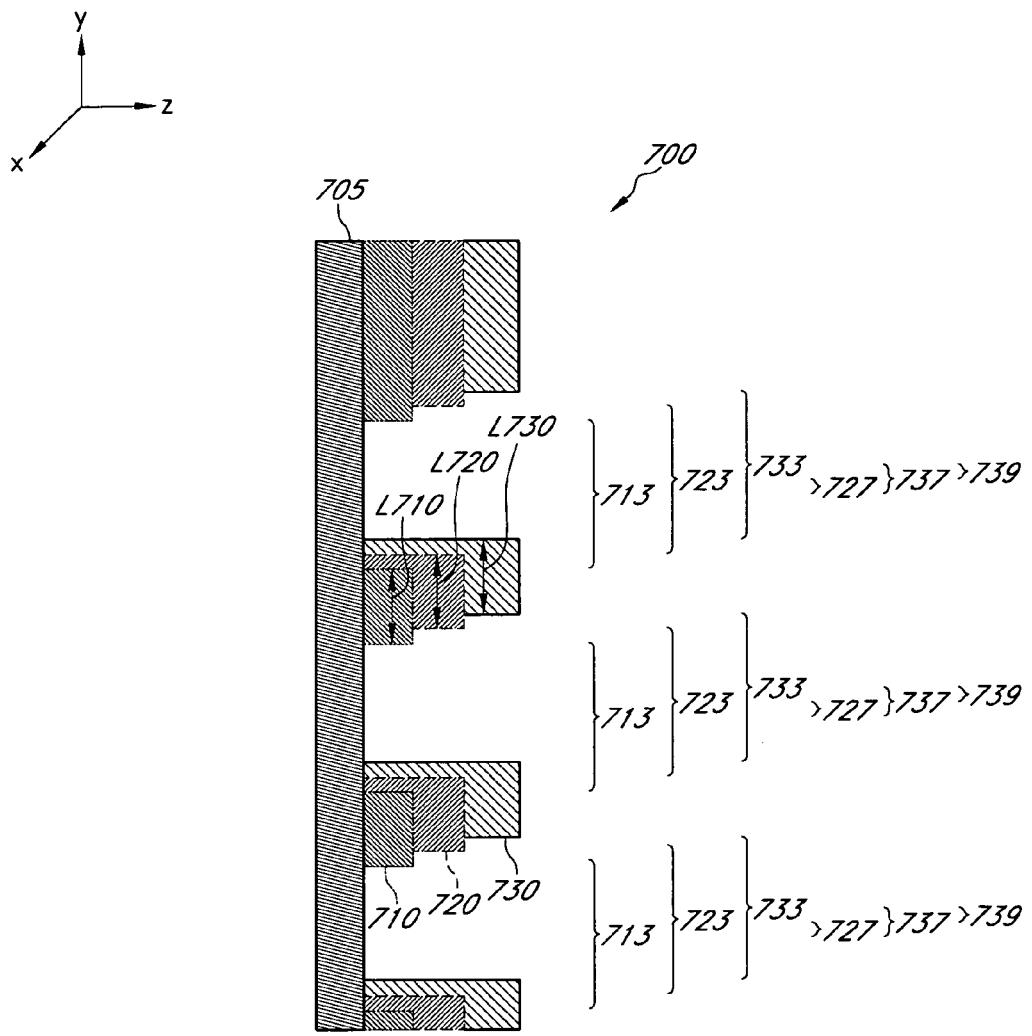
FIG. 7C illustrates a cross-sectional view of the structure of FIG. 7A taken along the line 7C-7C.

FIG. 7B is a cross-sectional view of the overlay structure 700 taken along line 7B-7B. If the second plurality of features 720 is not aligned properly, the offsets 726, 738 may be different from designed values. If the third plurality of features 730 is not aligned properly, the offsets 736, 738 may be different from designed values. FIG. 7C is a cross-sectional view of the overlay structure 700 taken along line 7C-7C. If the second plurality of features 720 is not aligned properly, the offsets 727, 739 may be different from designed values. If the third plurality of features 730 is not aligned properly, the offsets 737, 739 may be different from designed values.

FIGS. 8A through 8J depict schematic cross-sectional views of selected portions of one embodiment of a workpiece 800 in various stages of manufacturing. The method of manufacturing is only an example. It will be understood that the workpiece 800 may comprise intervening layers and structures, that the structures may comprise multiple materials, and that some steps may be skipped, modified, or added.

Figure 8A:
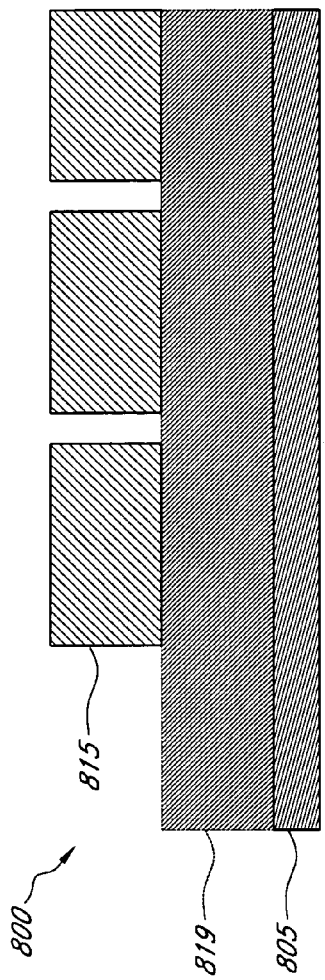

FIG. 8A illustrates a substrate 805 with a first layer 819 deposited thereon. Deposition of layer 819 may be by any deposition procedures or combination of deposition procedures now known or later developed, including, but not limited to oxidation, nitridation, chemical vapor deposition (CVD) (e.g., low pressure CVD (LPCVD) and plasma-enhanced CVD (PECVD)), atomic layer deposition (ALD), physical vapor deposition (PVD), electroplating, implantation, and spin coating. A first patterned layer 815 is then formed on the first layer 819. In certain embodiments, formation of the patterned layer 815 comprises a typical optical photolithography process (e.g., coating the workpiece with photoresist, exposing portions of the photoresist to a certain wavelength of light, and developing away either the exposed or unexposed portions of the photoresist) or electron-beam ("E-beam") lithography (e.g., coating the workpiece with an electron-sensitive material, illuminating portions of the electron-sensitive material with an E-beam, and removing portions of the electron-sensitive material that were not illuminated with the E-beam). Other patterning methods are also possible (e.g., x-ray lithography), and skilled artisans will appreciate the appropriateness of each method for particular applications.

Figure 8B:
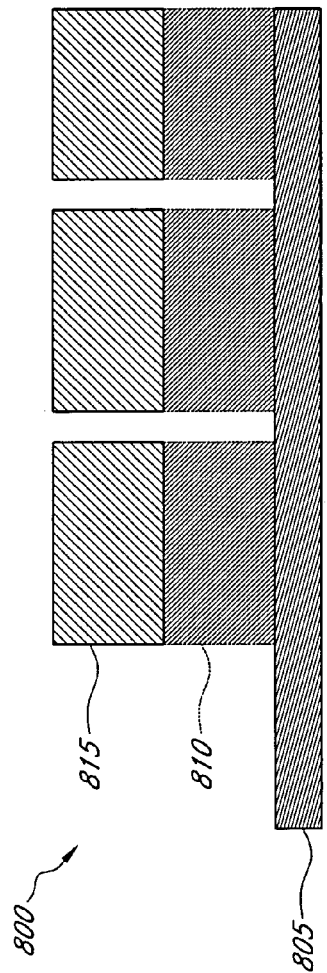
Figure 8C:
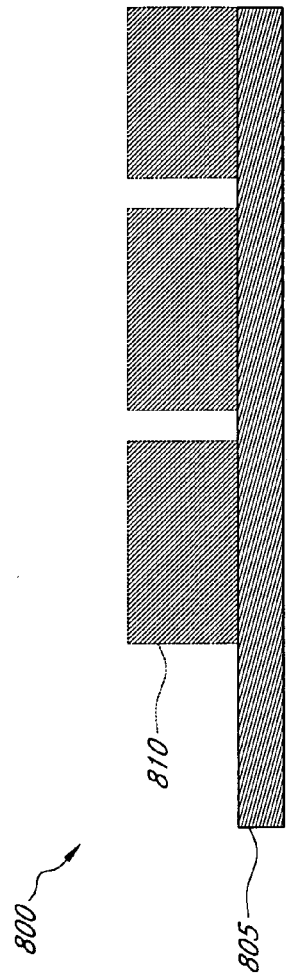

FIG. 8B illustrates the structure of FIG. 8A after portions of the layer 819 uncovered by the first patterned layer 815 have been removed to form a first overlay pattern 810. Removal of portions of the layer 819 may comprise any removal procedures or combination of removal procedures now known or later developed, including, but not limited to, dry etching (e.g., plasma-enhanced ionic etching), wet etching, isotropic etching, and anisotropic etching. It will be appreciated that the profile of the first overlay pattern 810 will vary depending on the removal process used. FIG. 8C illustrates the structure of FIG. 8B after the first patterned layer 815 has been removed. Removal of the first patterned layer 815 may comprise any patterned layer removal procedures or combination of or combinations of patterned layer removal procedures now known or later developed, including, but not limited to, ashing and wet stripping.

Figures 8D, 8E, 8F:
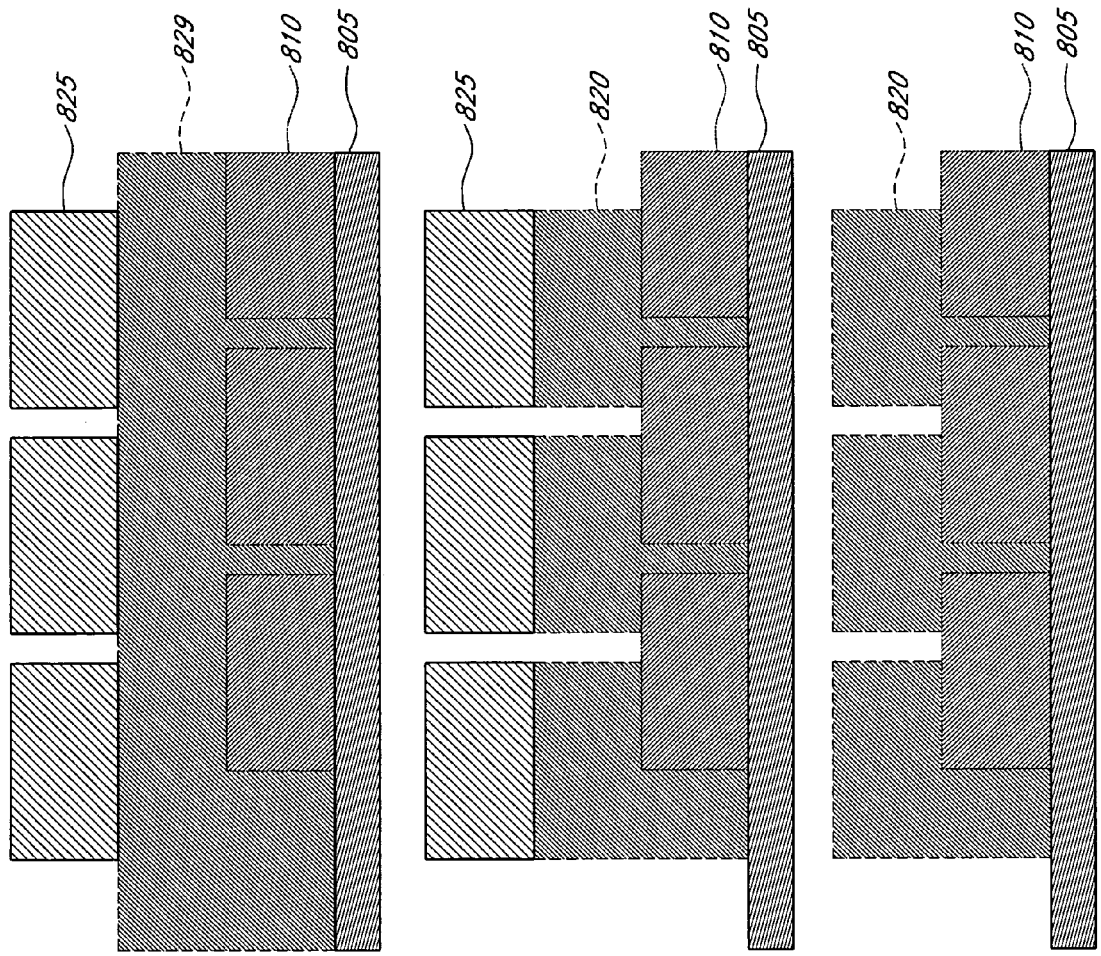

FIG. 8D illustrates the structure of FIG. 8C with a second layer 829 deposited thereon. A second patterned layer 825 is then formed on the second layer 829. In certain embodiments, reflectometry is performed on the structure depicted in FIG. 8D (e.g., as depicted in FIG. 1A). For example, the overlay and critical dimensions of the second patterned layer 825 may be measured prior to removal of the portions of the second layer 829 uncovered by the second patterned layer 825. If the overlay and/or critical dimensions of the second patterned layer 825 are outside of specified ranges of values, the second patterned layer 825 may advantageously be removed and reformed without substantially harming the second layer 829. If the overlay and/or critical dimensions of the second patterned layer 825 are within the specified ranges of values, the portions of the second layer 829 uncovered by the second patterned layer 825 may be removed to form second overlay pattern 820, as illustrated in FIG. 8E. In certain embodiments, reflectometry is performed on the structure depicted in FIG. 8E. FIG. 8F illustrates the structure of FIG. 8E after the second patterned layer 825 has been removed. In certain embodiments, reflectometry is performed on the structure depicted in FIG. 8F.

FIG. 8G illustrates the structure of FIG. 8F with a third layer 839 deposited thereon. A third patterned layer 835 is then formed on the third layer 839. In certain embodiments, reflectometry is performed on the structure depicted in FIG. 8G (e.g., as depicted in FIG. 1B). For example, the overlay and critical dimensions of the third patterned layer 835 may be measured prior to removal of the portions of the third layer 839 uncovered by the third patterned layer 835. If the overlay and/or critical dimensions of the third patterned layer 835 are outside of specified ranges of values, the third patterned layer 835 may advantageously be removed and reformed without substantially harming the third layer 839. If the overlay and/or critical dimensions of the third patterned layer 835 are within the specified ranges of values, the portions of the third layer 839 uncovered by the third patterned layer 835 may be removed to form third overlay pattern 830, as illustrated in FIG. 8H. In certain embodiments, reflectometry is performed on the structure depicted in FIG. 8H. FIG. 8I illustrates the structure of FIG. 8H after the third patterned layer 825 has been removed. In certain embodiments, reflectometry is performed on the structure depicted in FIG. 8I. FIG. 8J illustrates the structure of FIG. 8I with a fourth layer 849 deposited thereon. In certain embodiments, reflectometry is performed on the structure depicted in FIG. 8J.

The structures that form the devices on the workpiece 800 may be formed using the same layers that are used to form the overlay structures. The overlay structures may be used to ensure the quality and accuracy of the structures at particular layers, and thus the quality and accuracy of the devices formed by the structures. For example, if reflectometry indicates that an overlay structure is misaligned, that the critical dimension is incorrect, or that the layer is otherwise deficient, the corresponding structures may correspondingly be misaligned, incorrectly sized, or otherwise deficient. The defective layer may be removed, reformed, and remeasured until the overlay structure, and thus the corresponding structures that form the devices, meet the quality tolerances for overlay, critical dimensions, or other parameters.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. An overlay structure for measuring a parameter associated with a workpiece, said structure comprising:
    a first overlay pattern on said workpiece, said first overlay pattern comprising a first plurality of periodic features spaced apart from each other; and
    a second overlay pattern over said first overlay pattern, said second overlay pattern comprising a second plurality of substantially optically transmissive features spaced apart from each other, said second plurality of features offset with respect to and partially overlapping said first plurality of features, wherein said features and their separation in said first plurality of features are sufficiently small that said offset cannot be measured using an optical microscope, wherein said second overlay pattern substantially fills said spaces in said first overlay pattern.

2. The structure of claim 1, wherein said first and second pluralities of features each comprise between about 50 and 100 features.

3. The structure of claim 1, wherein said features in said first plurality of features are between about 0.3 and 1 μm wide.

4. The structure of claim 1, wherein said features in said first plurality of features are spaced apart between about 100 and 150 nm.

5. The structure of claim 1, wherein said first and second pluralities of features each comprise a plurality of substantially parallel lines.

6. The structure of claim 1, wherein said first and second pluralities of features each comprise a plurality of cuboids.

7. The structure of claim 1, further comprising a third overlay pattern over said second overlay pattern, said third overlay pattern comprising a third plurality of optically transmissive periodic features spaced apart from each other, said third plurality of features offset with respect to said first and second pluralities of features and partially overlapping said first and second overlay patterns.

8. The structure of claim 7, wherein said first overlay pattern comprises crystalline silicon, said second overlay pattern comprises polysilicon, and said third overlay pattern comprises photoresist.

9. The structure of claim 7, wherein said first overlay pattern comprises quartz, said second overlay pattern comprises molybdenum silicon, and said third overlay pattern comprises chromium.

10. The structure of claim 7, wherein said third overlay pattern substantially fills said spaces in said second overlay pattern.

11. The structure of claim 7, wherein said first overlay pattern comprises crystalline silicon, said second overlay pattern comprises polysilicon, and said third overlay pattern comprises aluminum.

12. The structure of claim 7, wherein said first overlay pattern comprises molybdenum silicon, said second overlay pattern comprises chromium, and said third overlay pattern comprises electron-sensitive material.

13. The structure of claim 7, wherein said first overlay pattern comprises tantalum hafnium, said second overlay pattern comprises chromium, and said third overlay pattern comprises electron-sensitive material.

14. The structure of claim 1, wherein said workpiece comprises a semiconductor workpiece.

15. The structure of claim 1, wherein said workpiece comprises a reticle workpiece.

16. The structure of claim 1, wherein said first and second pluralities of features each comprise between about 70 and 75 features.

17. The structure of claim 1, wherein said features in said first plurality of features are between about 0.45 and 0.5 µm wide.

18. The structure of claim 1, wherein said features in said first plurality of features are spaced apart by between about 100 and 150 nm.

19. The structure of claim 1, wherein said features in said first plurality of features are between about 0.3 and 1 µm wide and spaced apart by between about 100 and 150 nm.

20. The structure of claim 1, wherein said features in said first plurality of features are between about 0.45 and 0.5 µm wide and spaced apart by between about 110 and 120 nm.

21. The structure of claim 1, wherein said first and second pluralities of features are periodic along a first axis.

22. The structure of claim 21, wherein said offset between said first and second pluralities of features is along said first axis.

23. The structure of claim 1, wherein said first and second pluralities of features are periodic along first and second non-parallel axes.

24. The structure of claim 23, wherein said offset between said first and second pluralities of features is along first and second non-parallel axes.

25. The structure of claim 1, wherein said first plurality of features comprises an array of rows and columns arranged substantially parallel to first and second orthogonal axes.

26. The structure of claim 1, wherein said first overlay pattern comprises crystalline silicon and said second overlay pattern comprises photoresist.

27. The structure of claim 1, wherein said first overlay pattern comprises crystalline silicon and said second overlay pattern comprises polysilicon.

28. The structure of claim 1, wherein said first overlay pattern comprises molybdenum silicon and said second overlay pattern comprises chromium.

29. The structure of claim 1, wherein said first overlay pattern comprises tantalum hafnium and said second overlay pattern comprises chromium.

30. The structure of claim 1, wherein said first overlay pattern comprises chromium and said second overlay pattern comprises electron-sensitive material.

31. The structure of claim 1, wherein said first and second overlay patterns are located in scribe lines of said workpiece.

* * * * *

UNITED STATES PATENT AND TRADEMARK OFFICE
CERTIFICATE OF CORRECTION

| | | |
|---|---|---|
| PATENT NO. | : 7,642,550 B2 | Page 1 of 1 |
| APPLICATION NO. | : 11/492342 | |
| DATED | : January 5, 2010 | |
| INVENTOR(S) | : Ted L. Taylor | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 415 days.

Signed and Sealed this

Sixteenth Day of November, 2010

David J. Kappos
*Director of the United States Patent and Trademark Office*